United States Patent
Hatano et al.

(10) Patent No.: US 7,691,672 B2
(45) Date of Patent: Apr. 6, 2010

(54) SUBSTRATE TREATING METHOD AND METHOD OF MANUFACTURING SEMICONDUCTOR APPARATUS

(75) Inventors: Masaki Hatano, Kanagawa (JP); Hiroshi Asami, Shizuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/799,023

(22) Filed: Apr. 30, 2007

(65) Prior Publication Data
US 2007/0287265 A1 Dec. 13, 2007

(30) Foreign Application Priority Data
May 25, 2006 (JP) ............... 2006-144893

(51) Int. Cl.
*H01L 21/00* (2006.01)
(52) U.S. Cl. ............... 438/107; 438/118; 438/459; 257/E21.48; 257/E21.512
(58) Field of Classification Search ............ 438/109, 438/118, 458, 459, 106, 107, 455, 113, 108, 438/124, 126, 127, 667; 257/E21.48, E21.512, 257/E23.023, E23.067, E23.07, E23.137, 257/E23.144
See application file for complete search history.

(56) References Cited

U.S. PATENT DOCUMENTS

| 6,159,770 | A  | * | 12/2000 | Tetaka et al. | 438/112 |
| 6,365,432 | B1 | * | 4/2002  | Fukutomi et al. | 438/106 |
| 6,821,881 | B2 | * | 11/2004 | Tsai et al. | 438/626 |
| 6,958,544 | B2 | * | 10/2005 | Sunohara | 257/758 |
| 7,247,518 | B2 | * | 7/2007  | Shibata | 438/108 |
| 2003/0042618 | A1 | * | 3/2003 | Nose et al. | 257/778 |

FOREIGN PATENT DOCUMENTS

| JP | 08-213427       | 8/1996  |
| JP | 2003-171624     | 6/2003  |
| JP | 2004-241479     | 8/2004  |
| JP | 2004-356650     | 12/2004 |
| JP | 2005-191550     | 7/2005  |
| WO | WO 2005-119776  | 12/2005 |

\* cited by examiner

*Primary Examiner*—Julio J Maldonado
(74) *Attorney, Agent, or Firm*—Robert J. Depke; Rockey, Depke & Lyons, LLC

(57) ABSTRACT

The present invention provides a substrate treating method including the steps of joining a one-side surface of a substrate to be treated to a support substrate, treating the substrate to be treated in the condition where the substrate to be treated is supported by the support substrate, and removing the support substrate from the substrate to be treated. The step of joining the substrate to be treated to the support substrate includes melting a joint bump formed on the substrate to be treated so as to join the substrate to be treated to the support substrate, and the step of removing the support substrate from the substrate to be treated includes polishing the support substrate so as to remove the support substrate.

10 Claims, 19 Drawing Sheets

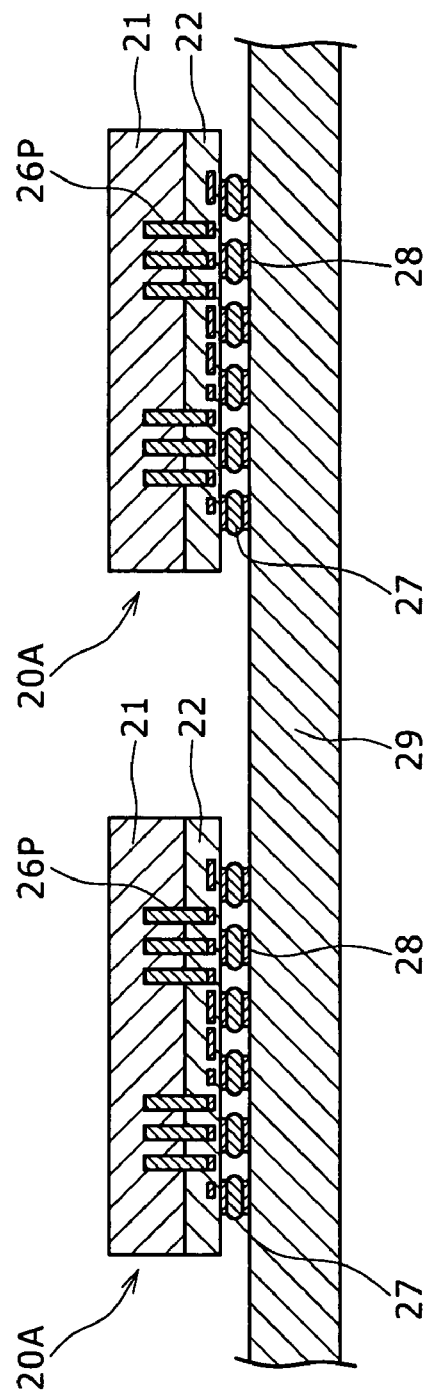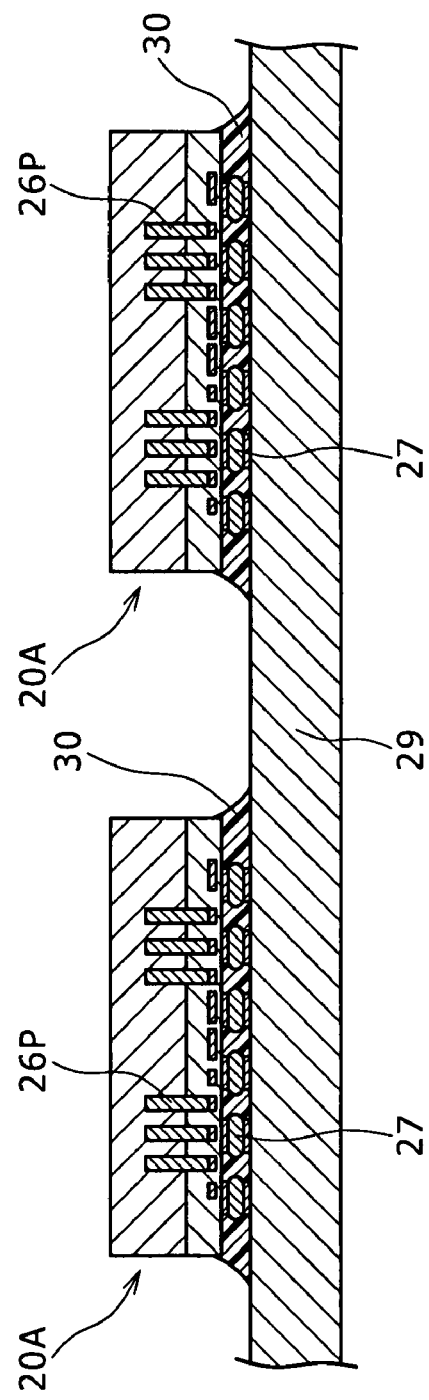

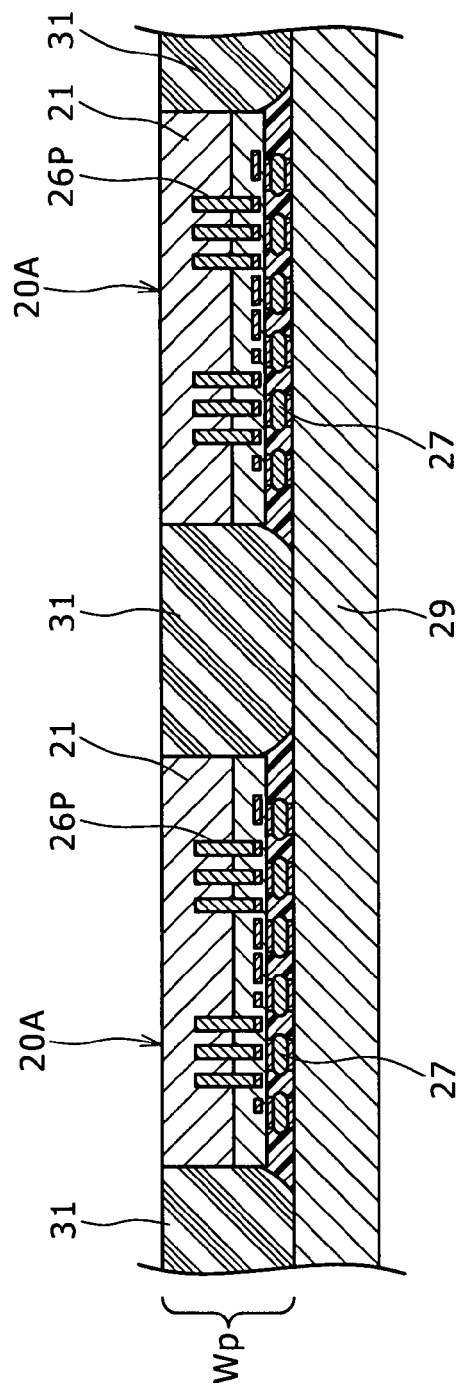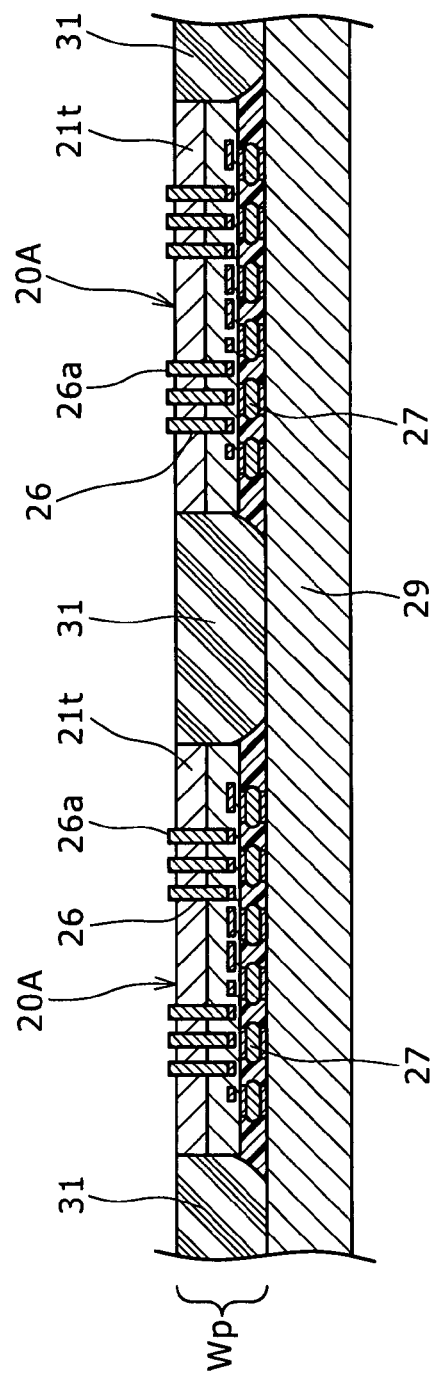

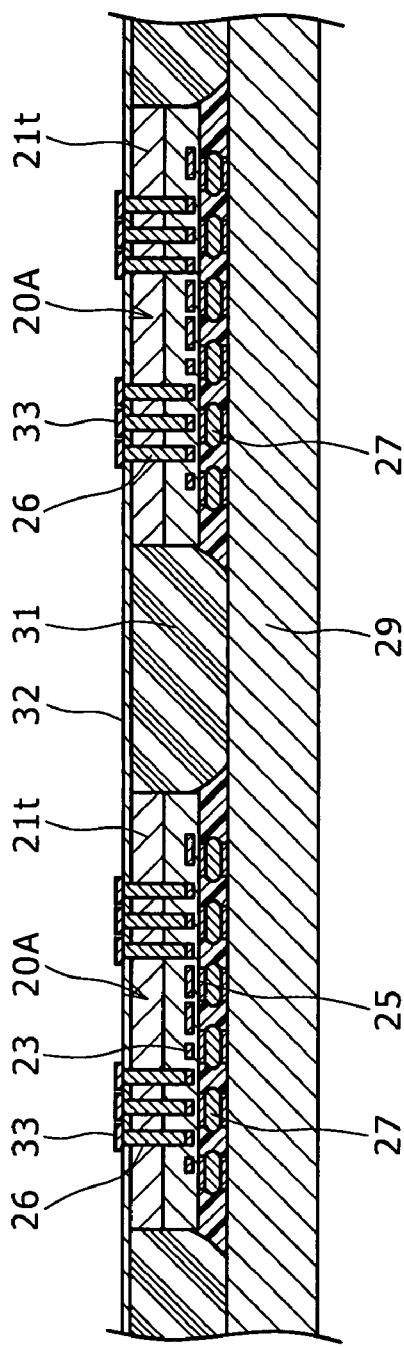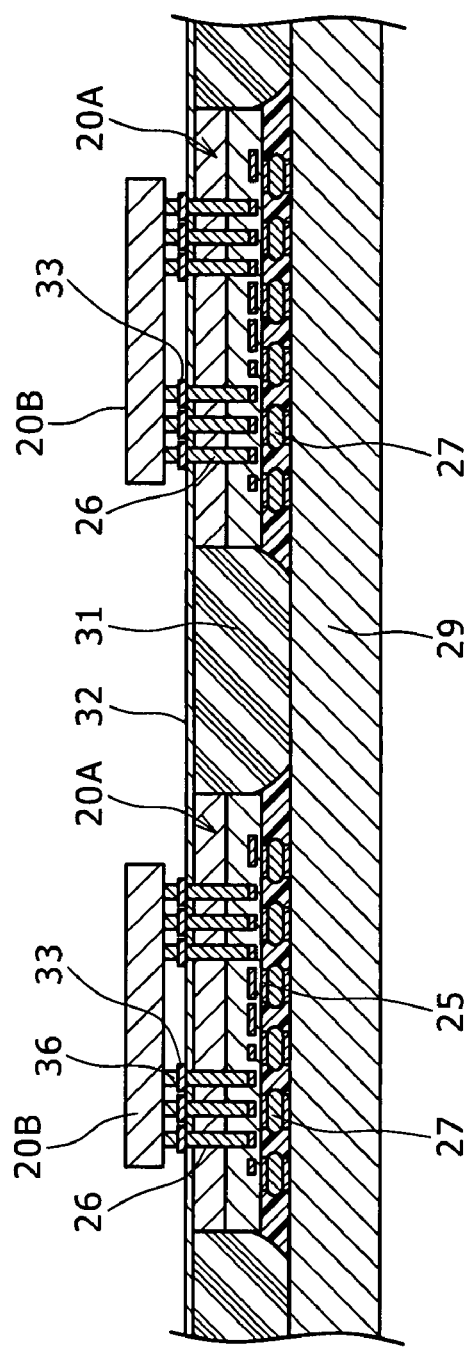

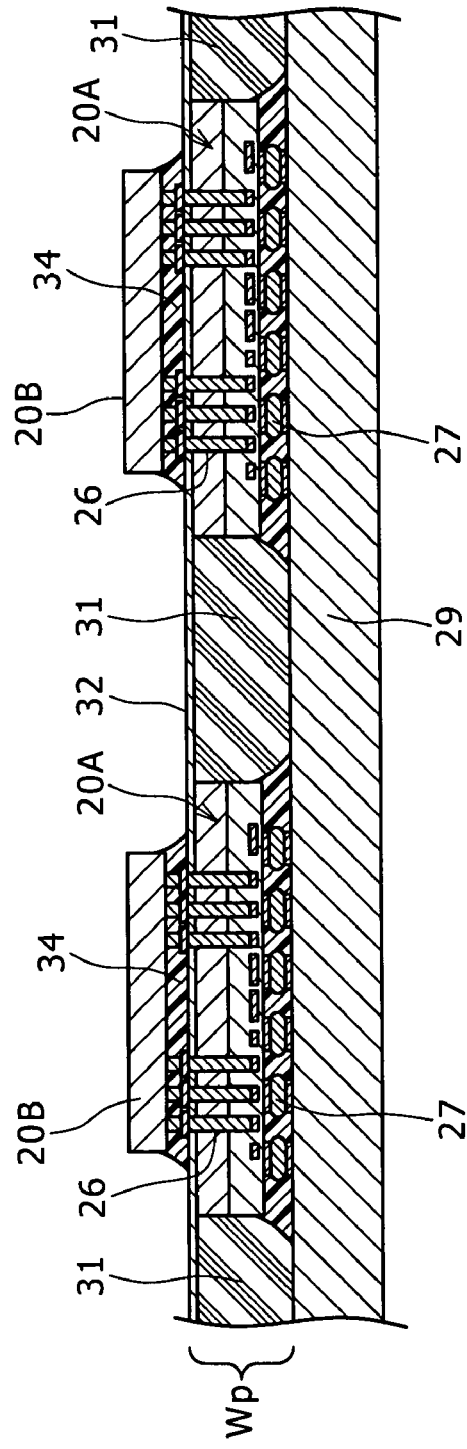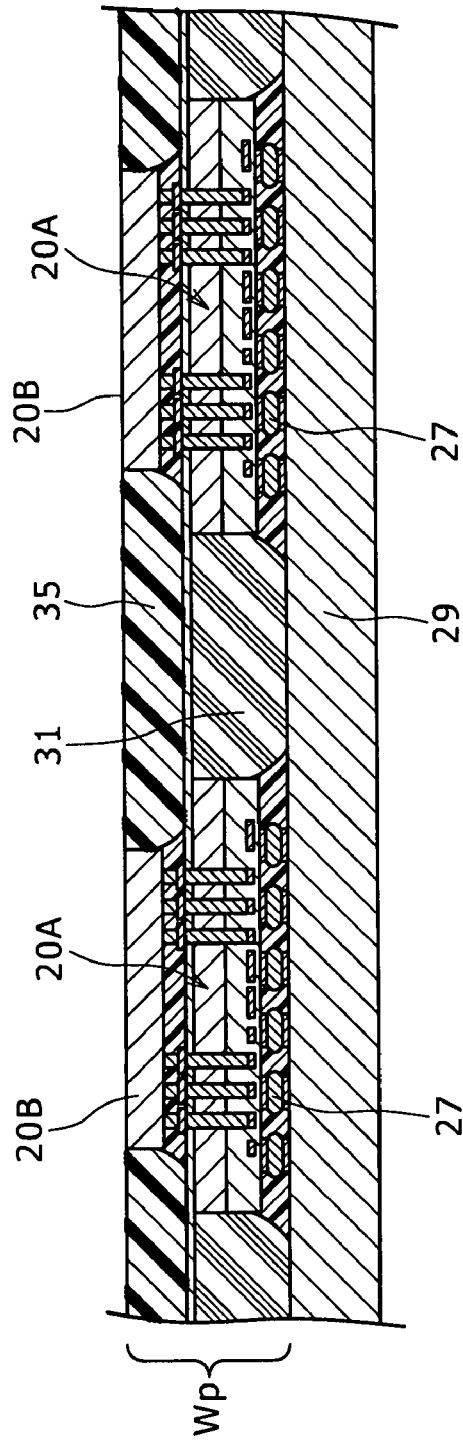

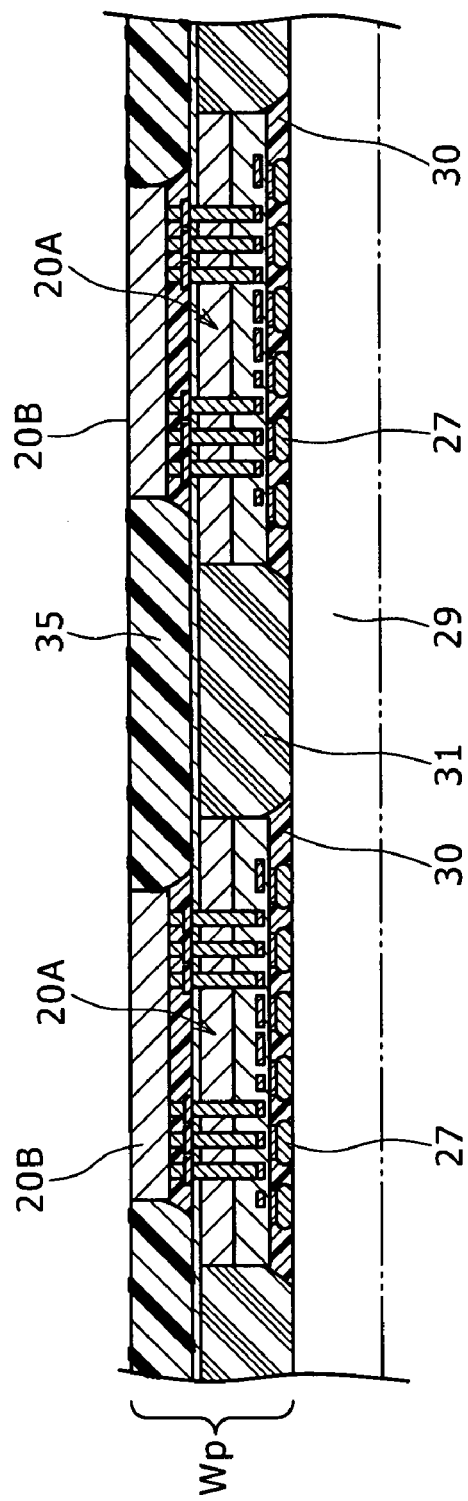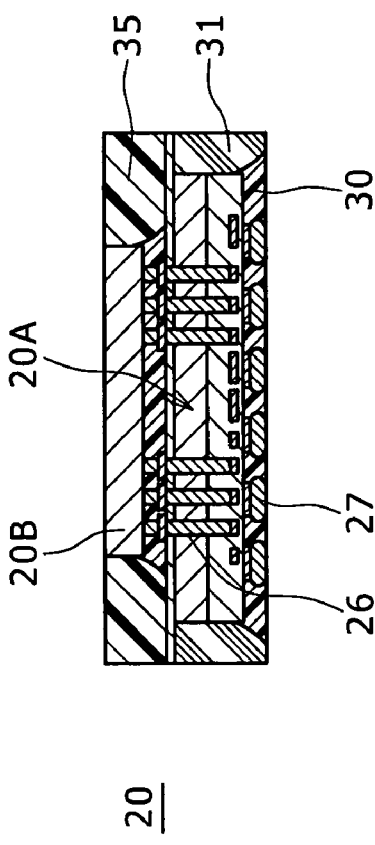

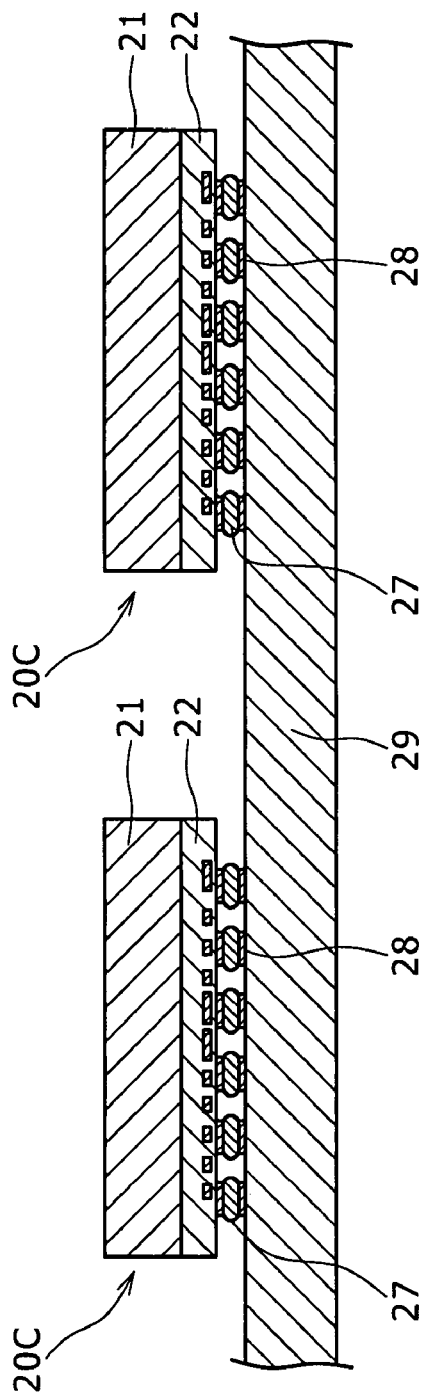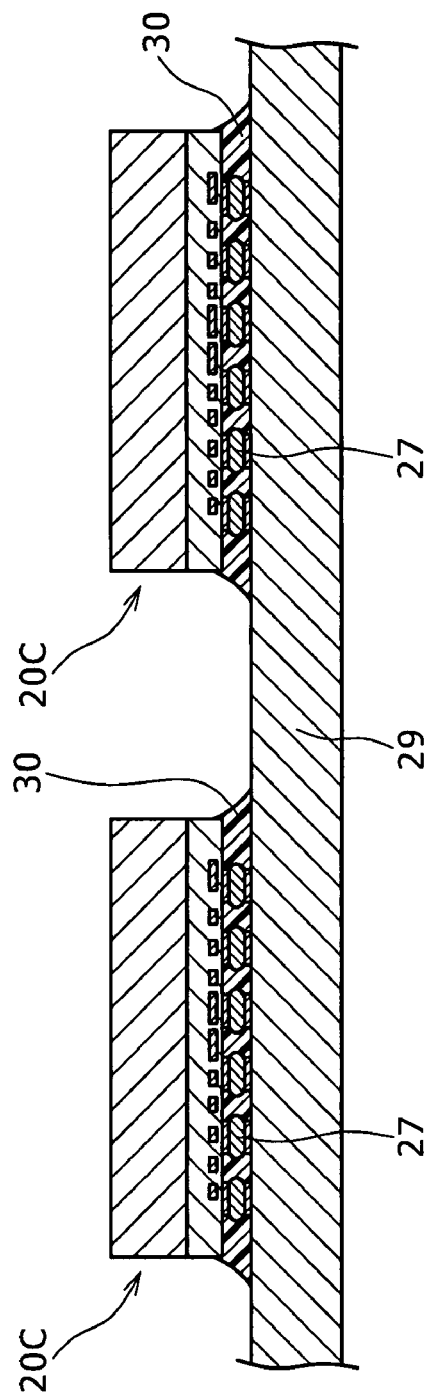

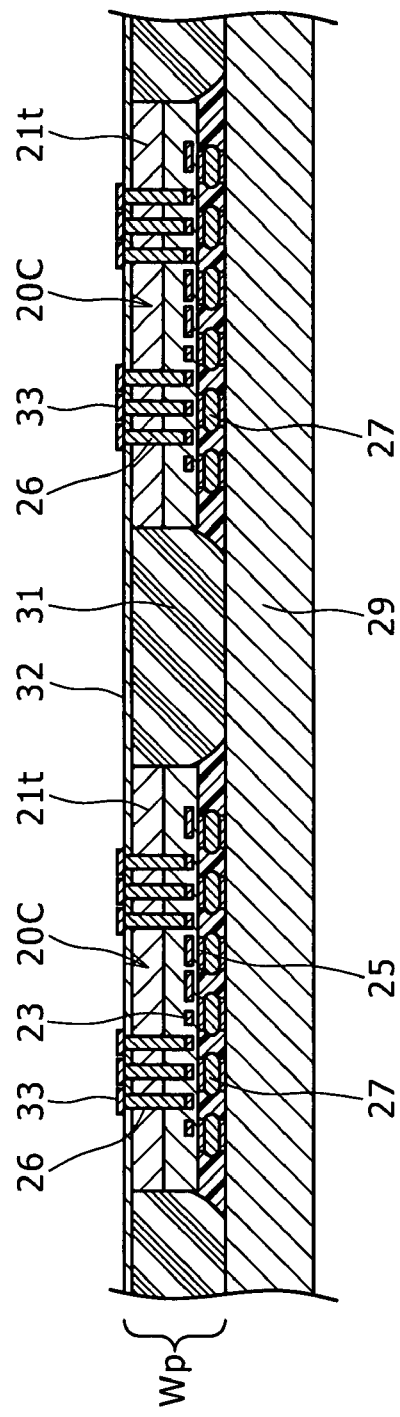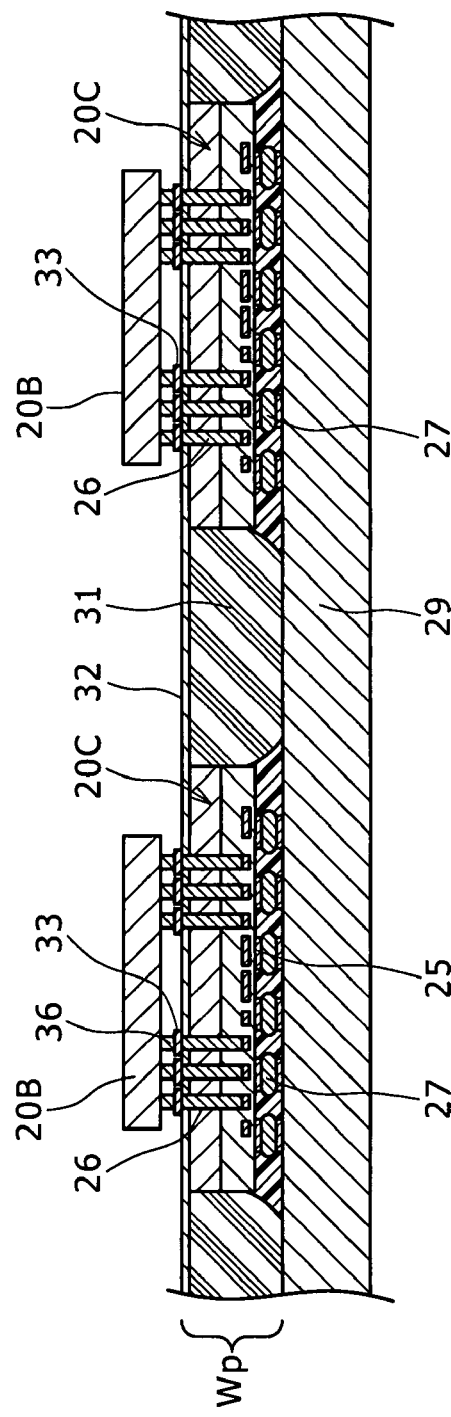

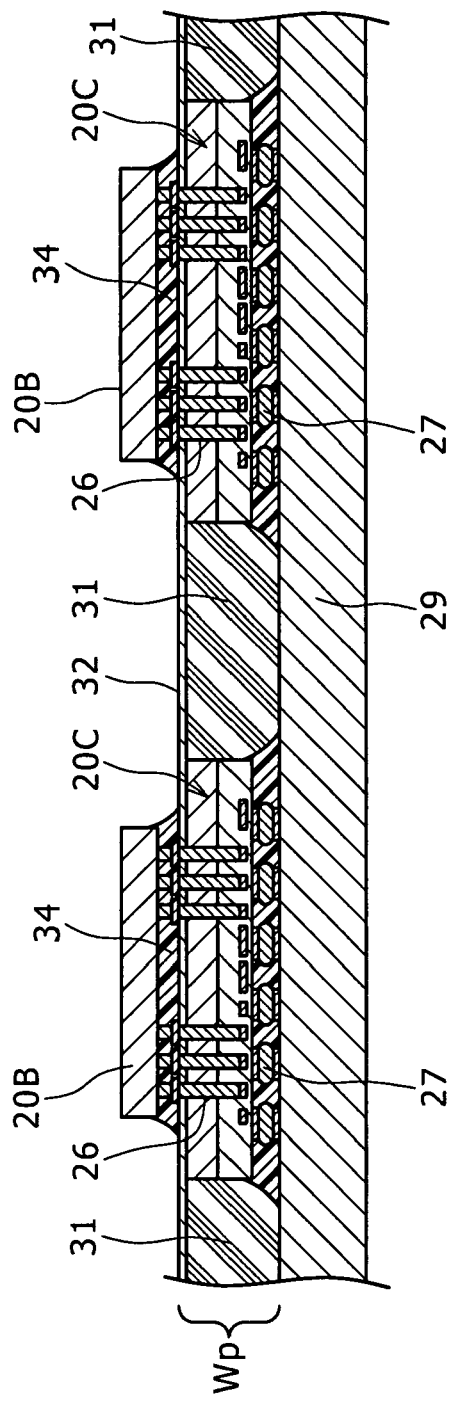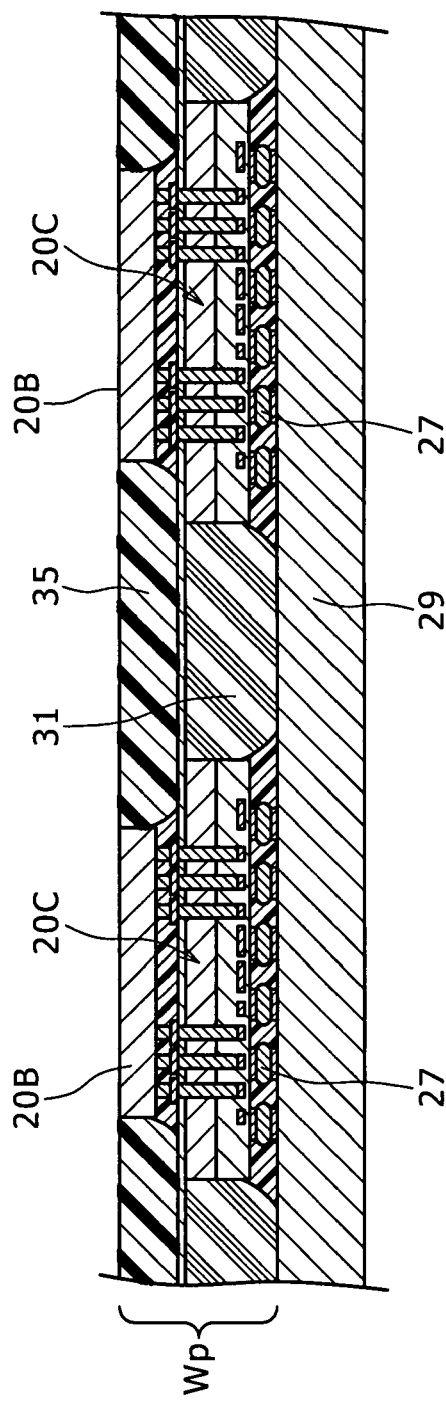

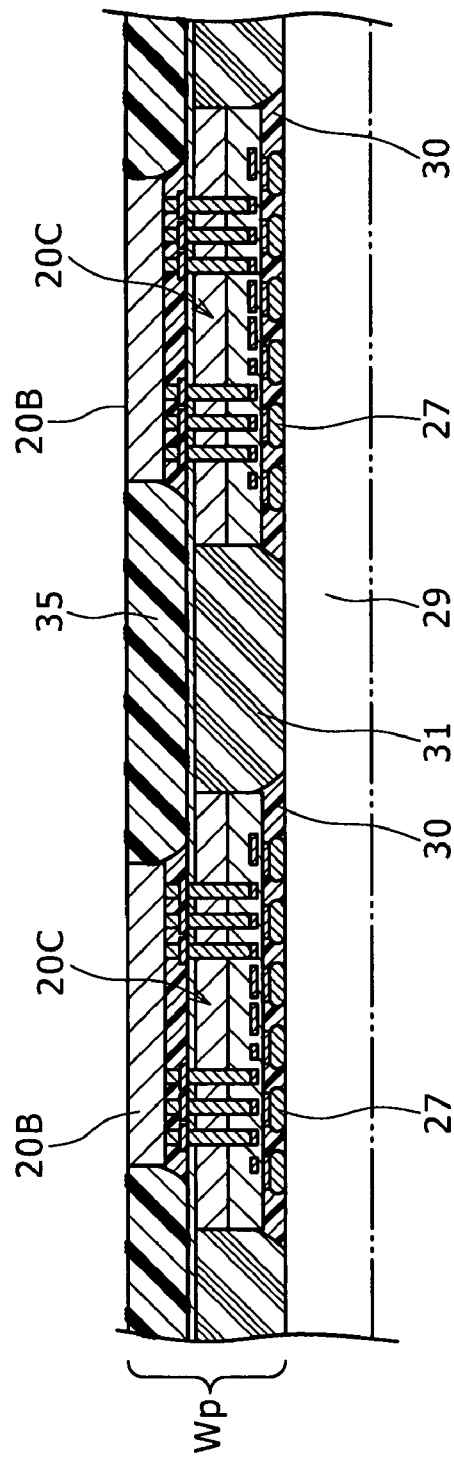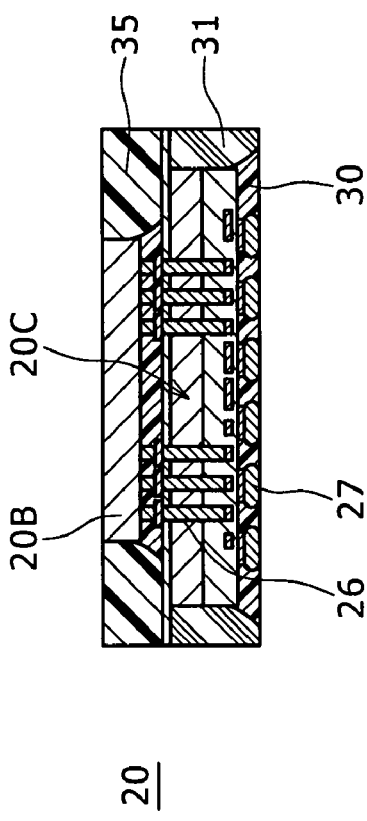

SUBSTRATE TREATING METHOD AND METHOD OF MANUFACTURING SEMICONDUCTOR APPARATUS

CROSS REFERENCES TO RELATED APPLICATIONS

The present invention contains subject matter related to Japanese Patent Application JP 2006-144893 filed in the Japanese Patent Office on May 25, 2006, the entire contents of which being incorporated herein by reference.

BACKGROUND OF THE INVENTION

The present invention relates to a substrate treating method for treating a substrate to be treated, such as a semiconductor substrate, in the condition where the substrate to be treated is supported by a support substrate, and a method of manufacturing a semiconductor apparatus by use of the substrate treating method.

In recent years, attendant on the demand for enhancement of the performances of electronic apparatuses and for reductions in the thickness and size of electronic apparatuses, the integration density and mounting density of electronic parts have been enhanced progressively, and semiconductor apparatuses of the MCM (Multi-Tip Module) or SIP (System-In-Package) type using the flip chip mounting have been coming to constitute a main stream. This kind of semiconductor apparatuses include those based on a configuration in which the flip chip mounting of a second semiconductor chip on a first semiconductor chip is adopted.

FIG. 3 is a sectional view showing a general configuration of this kind of semiconductor apparatus in the past. The semiconductor apparatus shown includes a first semiconductor chip 1 and a second semiconductor chip 2. The second semiconductor chip 2 is mounted on a substantially central area of a principal surface of the first semiconductor chip 1 by flip chip mounting in which a plurality of bumps 3 are used. In the periphery of the first semiconductor chip 1, a plurality of electrode pads 4 are formed in the manner of surrounding the region where the second semiconductor chip 2 is mounted. In addition, a dam 5 is provided between the chip mounting area and the forming region of the electrode pads 4, on the principal surface of the first semiconductor chip 1. The dam 5 is formed in a rectangular frame-like shape in plan view on the inner side of the forming region of the electrode pads 4 in such a manner as to surround the chip mounting region. Besides, the gap between the first semiconductor chip 1 and the second semiconductor chip 2 is filled with an underfill material 6.

The related-art semiconductor apparatus configured as above is adhered onto a mounting substrate 7 through an adhesive material layer 8 as shown in FIG. 3, and then electrical connection between the electrode pads 4 on the first semiconductor chip 1 and lands 9 on the mounting substrate 7 is made through bonding wires 10.

In recent years, in relation to such semiconductor apparatuses of the MCM or SIP type, there has been a demand for a higher signal processing speed, a smaller mounting area, and the like. Specifically, the semiconductor apparatus mounted by the wire bonding system shown in FIG. 3 has the problem of a delay in signal transfer due to the wiring length of the bonding wires 10 and the problem of securing the mounting area necessary for laying around the bonding wires 10.

In view of this, a configuration may be adopted in which, as schematically shown in FIG. 4, the first semiconductor chip 1 is provided with vias (through electrodes) 11 to establish inter-layer connection between the bumps 3 joined to the second semiconductor chip 2 on the upper layer side and bumps 12 joined to the mounting substrate 7 on the lower layer side. This configuration is very advantageous because it is thereby possible to simultaneously realize a higher signal processing speed and a smaller mounting area.

For forming the vias, it may be necessary to reduce the thickness of the wafer, in order to realize a shorter processing time and a reduced pitch. For thinning the wafer, back grinding has been practiced. Thus, as a method of forming vias, there has been known a method in which vias are buriedly formed from the face side of a wafer, and thereafter the back side of the wafer is ground so that terminal surfaces of the vias are exposed to the exterior (see Japanese Patent Laid-open No. 2004-241479).

Meanwhile, as the wafer thickness is reduced, the wafer becomes more liable to warp, and it becomes more difficult to handle the wafer. In view of this, it may be necessary to adhere a support substrate to the face side of the wafer, thereby enhancing the supportability of the wafer, and to appropriately remove the support substrate from the substrate to be treated, after the treatment of the substrate to be treated is completed.

As above-mentioned, the adhesive for adhesion between the support substrate and the wafer is necessary to have good temporary fixation performance for enduring the processing of the wafer and good stripping property for removal thereof after completion of the wafer processing. In relation to the technology of peeling (removing) the adhesive, there have been proposed, for example, a method of removing the adhesive by dissolution in a solvent, and a method of lowering the adhesiveness of the adhesive by irradiation with UV rays (see Japanese Patent Laid-open No. 2003-171624 and Japanese Patent Laid-open No. 2005-191550).

FIGS. 5A to 5J are step sectional views illustrating a method of manufacturing a semiconductor apparatus as a first related-art example.

First, as shown in FIG. 5A, there is prepared a wafer 100 in which a device layer 102 including semiconductor devices such as transistors, wirings 103, an insulating layer 104, and the like is formed on the face side of a substrate body (semiconductor substrate) 101 composed of silicon. Electrode pads 105 in conduction with parts of the wiring layer 103 are formed on the face side of the device layer 102, and a buried conductor layer 106P in conduction with parts of the wiring layer 103 is formed on the face side of the substrate body 101.

Next, as shown in FIG. 5B, solder bumps 107 are formed on the electrode pads 105 on the face side of the device layer 102. Subsequently, as shown in FIG. 5C, an adhesive is applied to the whole surface area of the device layer 102 inclusive of the solder bumps 107 to form an adhesive material layer 108, and a support substrate 109 is adhered onto the adhesive material layer 108. The support substrate 109 is composed of a glass substrate or silicon substrate provided therein with a plurality of through-holes 109a for supplying a stripping liquid.

Subsequently, as shown in FIG. 5D, in the condition where the wafer 100 is supported by the support substrate 109, the back side of the substrate body 101 is ground so as to thin the substrate body 101 to a predetermined thickness, and to expose tip portions 106a of the vias (buried conductor layer) 106 from the back side of the thinned substrate body 101t. Incidentally, though simplifiedly shown in the figure, the thinned substrate body 101t is in practice formed to be thicker than the device layer 102, and the support substrate 109 is in practice formed to be thicker than the substrate body 101t. In addition, in FIG. 5D and the latter figures, the wafer 101 is shown in the upside-down state (as compare with its posture in the former figures).

Thereafter, as shown in FIG. 5E, an insulating film 111 is formed on the back side of the substrate body 101t, and external connection terminals 112 are formed on the tip portions 106a of the vias 106. Then, as shown in FIG. 5F, semiconductor chips 113 are mounted on the external connection terminals 112 by flip chip mounting; thereafter, as shown in FIG. 5G, an underfill layer 114 is formed in the mounting areas of the semiconductor chips 113.

Next, as shown in FIG. 5H, the support substrate 109 is released (peeled) from the adhesive material layer 108. The support substrate 109 is released (peeled) by supplying a stripping liquid (e.g., alcohol) via the plurality of through-holes 109a formed in the inside of the support substrate 109 to thereby dissolve the adhesive material layer 108. Then, as shown in FIG. 5I, the adhesive material layer 108 is dissolved away, and thereafter the wafer 100 is diced on a chip basis, whereby semiconductor apparatuses 100A of a chip-on-chip structure having the vias (through electrodes) 106 as shown in FIG. 5J are manufactured.

In the next place, FIGS. 6A to 6I are step sectional views illustrating a method of manufacturing a semiconductor apparatus as a second related-art example. Incidentally, in the figures, the portions corresponding to those in the first related-art example described above are denoted by the same symbols as used above, and detailed descriptions of these portions will be omitted.

In this example of the related art, the steps of forming solder bumps 107 on the face side of a wafer 100 and thereafter adhering a support substrate are the same as those in the first related-art example (FIGS. 6A to 6C). It should be noted that this example differs from the first related-art example in that the support substrate 119 is adhered to the face side of the wafer 100 through an adhesive material layer 118 formed of an adhesive of which the adhesiveness is deteriorated by irradiation with UV rays. The support substrate 119 is composed of a glass substrate which is transparent to UV rays.

Then, like in the first related-art example, the steps of thinning a substrate body 101 (FIG. 6D), forming external connection terminals 112 (FIG. 6E), mounting semiconductor chips 113 (FIG. 6F), and forming an underfill layer 114 (FIG. 6G) are conducted. Thereafter, the step of irradiating the adhesive material layer 118 with UV rays through the support substrate 119 to thereby release (peel) the support substrate 119 from the wafer 100 is carried out (FIG. 6H). Then, the wafer 100 is diced on a chip basis, whereby semiconductor devices 100A of the chip-on-chip structure having the vias (through electrodes) 106 as shown in FIG. 6I are manufactured.

SUMMARY OF THE INVENTION

As has been mentioned above, the adhesive material 108, 118 for adhesion between the wafer 100 and the support substrate 109, 119 is necessary to have good temporary fixation performance for enduring the processing of the wafer and good stripping property for removal thereof after completion of the wafer processing. In the above-mentioned examples of the related art, therefore, an adhesive soluble in organic solvents or an adhesive of which the adhesive force can be lowered by irradiation with UV rays has been used to form the adhesive material layer 108, 118.

However, these adhesives are generally low in heat resistance, and a lowering in the adhesiveness or stripping property thereof would be generated when they are heated to above the heat resisting temperature thereof. This leads to the problem that a high-temperature treatment above the heat resisting temperature of the adhesive material layer 108, 118 is not applied during the wafer processing.

For example, in the case of an insulating film such as an $SiO_2$ film, the film quality is more excellent and the adhesion of the film to a silicon substrate is better as the film forming temperature is higher. However, such a high-temperature treatment is not applied to a substrate supported on a support substrate by adhesion as above-mentioned, so that it would be necessary to adopt a low-temperature film forming process such as low-temperature CVD process. As a result, in the step of forming the insulating film 111 on the back side of the substrate body 101t (FIG. 5E, FIG. 6E), it would be difficult to secure reliability of the insulating film 111. In addition, in the step of joining the semiconductor chips 113 (FIG. 5F, FIG. 6F), it would be necessary to use a low-temperature solder meltable below the heat resisting temperature of the adhesive material layer 108, 118, causing restrictions in selection of materials.

Besides, the above-mentioned adhesive material layers 108, 118 are low not only in heat resistance but also in chemical resistance; therefore, they have the problem that the chemical or the method for treating them without causing damage thereto, such as dissolution and denaturing deterioration, would be limited. Particularly, the adhesive material layer 108 is low in resistance to resist stripping liquids which contain such a solvent as PGMEA (Propylene Glycol Monomethyl Ether Acetate), ECA (Ethyl Cellosolve Acetate), etc. Therefore, there is the problem that in the step of patterning the insulating film 111 or in the step of forming the external connection terminals 112 (FIG. 5E), the method for treating the pattern resist would be restricted (e.g., dipping is not conducted).

Thus, there is a need for a substrate treating method, and a method of manufacturing a semiconductor apparatus, by which a substrate can be appropriately supported without using an adhesive material layer necessary for having good temporary fixation performance and good stripping property (removability) and by which a support substrate can be removed appropriately.

According to one embodiment of the present invention, a substrate treating method includes the steps of joining a one-side surface of a substrate to be treated to a support substrate, treating the substrate to be treated in the condition where the substrate to be treated is supported by the support substrate, and removing the support substrate from the substrate to be treated. The step of joining the substrate to be treated to the support substrate includes melting a joint bump formed on the substrate to be treated so as to join the substrate to be treated to the support substrate, and the step of removing the support substrate from the substrate to be treated includes polishing the support substrate so as to remove the support substrate.

In the one embodiment of the present invention, the joining between the support substrate and the substrate to be treated is conducted by fusing of the joining bump(s) formed on the substrate to be treated, and the removal of the support substrate is conducted by polishing the support substrate, so that an adhesive having good temporary fixation performance and good stripping property (removability) necessary in the related art can be unnecessitated. This ensures that the processing of the substrate to be treated can be carried out without restrictions as to the heat resisting temperature or the chemical resistance of an adhesive. Therefore, it is possible, for example, to form an insulating film excellent in adhesion and to stably pattern the terminal surfaces.

In addition, by use of the substrate treating method according to the one embodiment of the present invention, a semiconductor apparatus of a chip-on-chip structure in which a semiconductor chip on the lower layer side is provided with vias (through electrodes) for inter-layer connection can be manufactured with high accuracy and high reliability.

According to another embodiment of the present invention, a method of manufacturing a semiconductor apparatus includes the steps of: fabricating a plurality of first semiconductor chips each provided on a surface thereof with a bump for external connection; joining the plurality of first semiconductor chips to a support substrate through the bumps; filling the spaces between the plurality of first semiconductor chips with an insulating material so as to form a pseudo-wafer on the support substrate; polishing the pseudo-wafer so as to reduce the thickness of each of the first semiconductor chips; forming an external connection terminal electrically connected to the bump, on the back side of each of the first semiconductor chips; mounting second semiconductor chips on the external connection terminals; removing the support substrate by polishing so as to expose the bumps; and dicing the pseudo-wafer on a chip basis.

The plurality of first semiconductor chips are produced by dicing the common semiconductor wafer on a chip basis. In view of this, when acceptable chips selected from among the produced individual chips are used as the semiconductor chips to be bump-bonded onto the support substrate, it is possible to contrive an enhanced yield of the semiconductor apparatus manufactured.

The formation of the vias in the first semiconductor chips can be carried out during or after the thinning step conducted in the condition where the first semiconductor chips are supported by the support substrate. In this case, when the spaces (clearances) between the plurality of first semiconductor chips mounted on the support substrate are filled with an insulating material to obtain the first semiconductor chips in a pseudo-wafer, the plurality of first semiconductor chips can be simultaneously thinned by polishing the pseudo-wafer, and it is possible to contrive an appropriate polishing treatment through maintaining flatness of the polished surface.

As for the method of forming the vias during the step of thinning the first semiconductor chips, a buried conductor layer electrically connected to the bumps is preliminarily formed at a wafer level stage, and tip port ions of the buried conductor layer are exposed from the back side of the chips at the time of thinning the chips. Then, the terminal surfaces thus exposed are treated, to thereby form the external connection terminals to be joined to the second semiconductor chips on the upper layer side.

The removal of the support substrate by polishing is carried out after the second semiconductor chips are mounted on the first semiconductor chips. In this case, when the second semiconductor chips are preliminarily sealed with a sealing resin layer, it is possible to stably support the laminate of the first and second semiconductor chips prepared in the form of the pseudo-wafer at the time of polishing. In addition, the joining bumps exposed upon the removal of the support substrate can, as they are, be used as external terminals.

Thus, according to the substrate treating method according to the one embodiment of the present invention, the supporting of the substrate to be treated by the support substrate and the removal of the support substrate from the substrate to be treated can be carried out appropriately, without using an adhesive necessary for having good temporary fixation performance and good stripping property (removability).

In addition, according to the method of manufacturing a semiconductor apparatus according to the another embodiment of the present invention, a semiconductor apparatus of the chip-on-chip structure in which the vias (through electrodes) for inter-layer connection can be manufactured with high accuracy and high reliability.

BRIEF DESCRIPTION OF THE DRAWINGS

FIGS. 1C and 1D are step sectional views for illustrating the method of manufacturing a semiconductor apparatus according to the first embodiment of the present invention;

FIGS. 1E and 1F are step sectional views for illustrating the method of manufacturing a semiconductor apparatus according to the first embodiment of the present invention;

FIGS. 1G and 1H are step sectional views for illustrating the method of manufacturing a semiconductor apparatus according to the first embodiment of the present invention;

FIGS. 1I and 1J are step sectional views for illustrating the method of manufacturing a semiconductor apparatus according to the first embodiment of the present invention;

FIGS. 1K and 1L are step sectional views for illustrating the method of manufacturing a semiconductor apparatus according to the first embodiment of the present invention;

FIGS. 2C and 2D are step sectional views for illustrating the method of manufacturing a semiconductor apparatus according to the second embodiment of the present invention;

FIGS. 2G and 2H are step sectional views for illustrating the method of manufacturing a semiconductor apparatus according to the second embodiment of the present invention;

FIGS. 2I and 2J are step sectional views for illustrating the method of manufacturing a semiconductor apparatus according to the second embodiment of the present invention;

FIGS. 2K and 2L are step sectional views for illustrating the method of manufacturing a semiconductor apparatus according to the second embodiment of the present invention;

DETAILED DESCRIPTION OF THE PREFERRED EMBODIMENTS

Figure 1A:
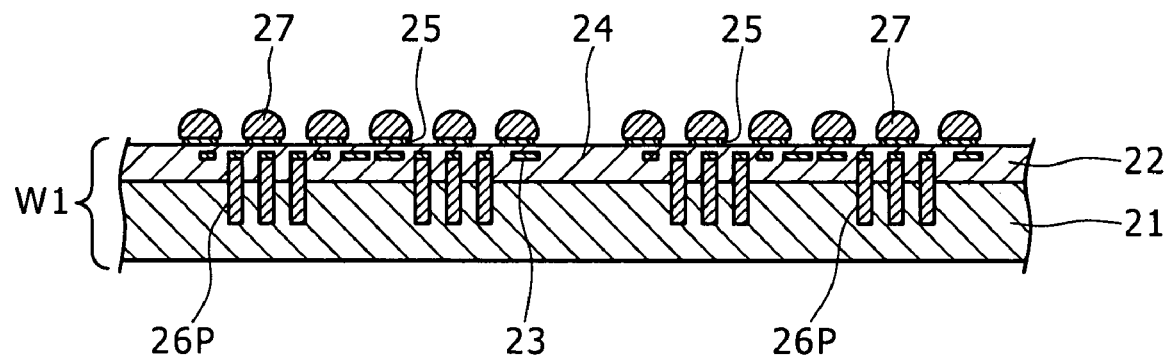
FIGS. 1A and 1B are step sectional views for illustrating a method of manufacturing a semiconductor apparatus according to a first embodiment of the present invention.

Now, some embodiments of the present invention will be described below referring to the drawings. In each of the embodiments below, an example in which the present invention is applied to the manufacture of a semiconductor apparatus of the chip-on-chip structure will be described.

First Embodiment

FIGS. 1A to 1L are step sectional views for illustrating the method of manufacturing a semiconductor apparatus of the chip-on-chip structure according to a first embodiment of the present invention.

First, as shown in FIG. 1A, there is prepared a wafer W1 in which a device layer 22 including semiconductor devices, such as transistors, wiring 23, an insulating layer 24, and the like is formed on the face side of a substrate body (semiconductor substrate) 21 composed of silicon. The wafer W1 corresponds to the "substrate to be treated" in the embodiment of the present invention.

A plurality of electrode pads 25 electrically connected to parts of the wiring 23 are disposed on the face side of the device layer 22, and bumps 27 are formed on the electrode pads 25. The bumps 27 may be composed, for example, solder bumps, and function as "joining bumps" in the embodiment of the present invention which are joined to a support substrate 29 described later.

The device layer 22 is preliminarily provided therein with a buried conductor layer 26P formed of copper, for example. The buried layer 26P is formed to have a predetermined depth (e.g., 200 μm or less) such as not to penetrate the substrate body 21, and are electrically connected to the electrode pad 25 (and, hence, to the bumps 27) through parts of the wiring 23. Incidentally, the periphery of the buried conductor layer 26P is covered with an insulating film formed, for example, of $SiO_2$, for electrical insulation from the substrate body 21.

Figure 1B:
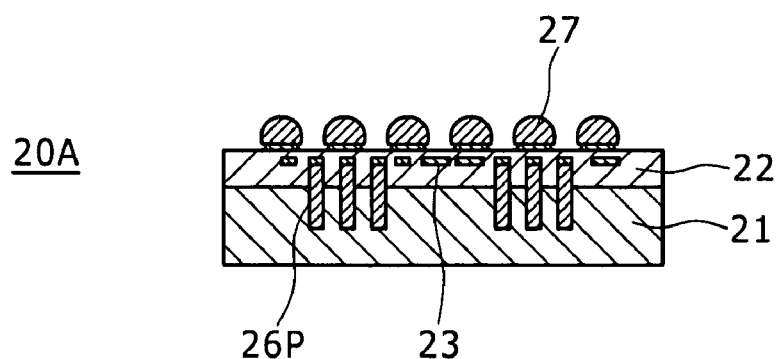

Then, as shown in FIG. 1B, the wafer W1 is diced on a chip basis, to produce a plurality of semiconductor chips 20A shown in the figure. The semiconductor chip 20A corresponds to the "first semiconductor chip" in the embodiment of the present invention.

Next, as shown in FIG. 1C, a plurality of the semiconductor chips 20A produced as above are joined onto the support substrate 29 through the bumps 27. The support substrate 29 is preliminarily provided with dummy terminals 28 correspondingly to the array pitch of the bumps 27 on the semiconductor chips 20A, and the bumps 27 are fused to the dummy terminals 28, whereby the semiconductor chips 20A are integrally fixed onto the support substrate 29, with their back side up. The joining of the semiconductor chips 20A to the support substrate 29 is conducted by the same technique as that of general flip chip bonding, so that this step can be carried out by use of an existing mounter equipment.

The support substrate 29 is formed of a material having a coefficient of thermal expansion comparable to that of the substrate body 21, i.e., is composed of a glass substrate, a silicon substrate, or the like. The thickness of the support substrate 29 is not particularly limited. Preferably, however, the support substrate 29 is formed in a thickness on such a level as to secure a rigidity sufficient for handling thereof at the time of thinning a pseudo-wafer, which is obtained by filling the spaces (clearances) between the semiconductor chips 20A with an insulating material as will be described later. For example, the thickness is not less than 700 μm.

Subsequently, as shown in FIG. 1D, the gap between each semiconductor chip 20A and the support substrate 29 after the flip chip bonding is filled with an underfilling resin, to form an underfill layer 30. As the underfilling resin, there can be used a thermoplastic resin, such as epoxy resin, which is used for general flip chip bonding.

Next, as shown in FIG. 1E, the spaces (clearances) between the semiconductor chips 20A joined onto the support substrate 29 are filled with an insulating material 31, to form a pseudo-wafer Wp flattened on the upper side. The pseudo-wafer Wp is formed, for example, by use of a wafer molding technology used for producing a wafer level CSP (Chip Size Package). As the insulating material 31, a wafer molding resin used for the wafer level CSP or the like is used.

Since the semiconductor chips 20A assembled into the pseudo-wafer as above-mentioned can be handled in the wafer state in the subsequent processings, an existing processing equipments can be used as they are. In addition, when acceptable chips selected preliminarily through electrical measurement are used as the semiconductor chips 20A to be joined to the support substrate 29 and they are assembled into the pseudo-wafer by a wafer molding technology, the pseudo-wafer can be subjected to the subsequent processings as a wafer in which acceptable chips are arranged. This promises an enhanced productivity and an enhanced yield.

Next, as shown in FIG. 1F, the pseudo-wafer Wp formed on the support substrate 29 is polished so as to thin the substrate body 21 for each semiconductor chip 20A, and to expose tip portions 26a of the vias 26 (the buried conductor layer 26P) from the back side of the thinned substrate body 21t.

In this step, for example, the substrate body 21 is polished together with the insulating material 31 until the tip portions 26a of the vias 26 are exposed from the back side (polished surface) of the substrate body 21, and thereafter chemical etching is applied to the back side of the substrate body 21t so as to protrude the tip portions 26a of the vias 26. In addition, the structure in which the spaces (clearances) between the semiconductor chips 20A mounted are filled with the insulating material 31 ensures that the polished surface can be kept flat (planar), and the thinning of the plurality of semiconductor chips 20A can be carried out simultaneously, appropriately, and stably. Incidentally, as the polishing method, any of known polishing technologies such as back grinding (BGR) and chemical mechanical polishing (CMP) can be used either singly or in combination.

Subsequently, as shown in FIG. 1G, a predetermined insulating treatment, for example, formation of an insulating film 32, is applied to the back side of each semiconductor chip 20A, and external connection terminals 33 are formed on the tip portions 26a of the vias 26. The external connection terminal 33 is electrically connected to the bump 27 through the via 26, the wiring 23, and the electrode pad 25. The formation of the external connection terminals 33 can be carried out by use of a re-wiring technology for wafer level CSP or a wiring technology in semiconductor process.

Next, as shown in FIG. 1H, second semiconductor chips 20B are mounted onto the external connection terminals 33 on the (first) semiconductor chips 20A. A plurality of bumps 36 are preliminarily formed on the mounting surface of each semiconductor chip 20B, and the semiconductor chip 20B is joined onto the external connection terminals 33 by flip flop bonding through the bumps 36.

Thereafter, as shown in FIG. 1I, an underfill layer 34 is formed between the first semiconductor chips 20A and the second semiconductor chips 20B which are joined to each other. As the resin material constituting the underfill layer 34, for example, the same material as that of the underfill layer 30 described referring to FIG. 1D above can be used.

Next, as shown in FIG. 1J, a sealing layer 35 is formed on the pseudo-wafer Wp, to fill up the spaces (clearances) between the mounted second semiconductor chips 20B with the resin constituting the sealing layer 35, whereby the upper surface of the pseudo-wafer Wp is made flat (planar). The sealing layer 35 can be formed, for example, by the wafer molding technology used in the wafer level CSP. As the resin constituting the sealing layer 35, for example, a molding resin for wafer level CSP can be used. In addition, with the sealing layer 35 thus formed, semiconductor apparatuses having a stack structure of the first and second semiconductor chips 20A and 20B can be obtained in the form of pseudo-wafer on the support substrate 29. Incidentally, the sealing layer 35 may be polished so as to thin the second semiconductor chips 20B, if necessary.

Subsequently, as shown in FIG. 1K, the support substrate 29 is removed from the pseudo-wafer Wp. The removal of the support substrate 29 is carried out by polishing the support substrate 29 by use of BGR or CMP. The step of removing the support substrate 29 is conducted until the bumps 27 of the first semiconductor chips 20A are exposed from the lower surface of the pseudo-wafer Wp. In this case, since the upper surface of the pseudo-wafer Wp has been made flat (planar) by the presence of the sealing layer 35, the pseudo-wafer Wp can be supported stably and appropriately by support jigs in a polishing equipment, whereby an appropriate polishing treatment of the support substrate 29 can be promised.

The bumps 27 can later be used as connection terminals for a mounting substrate (not shown). Besides, since the periphery of each of the bumps 27 is supported by the underfill layer 30, the step of exposing the bumps 27 during the removal of the support substrate 29 by polishing can be performed appropriately.

Finally, as shown in FIG. 1L, the pseudo-wafer Wp deprived of the support substrate 29 is diced on a chip basis, to produce semiconductor apparatuses 20 having a three-dimensional stack structure of the first and second semiconductor chips 20A and 20B.

In the semiconductor apparatus 20, electrical connection between the second semiconductor chip 20B and the first semiconductor chip 20A and electrical connection between the second semiconductor chip 20B and the bumps 27 are realized through the vias 26 formed in the first semiconductor chip 20A. Besides, in the semiconductor apparatus 20, an armor package for protecting the first and second semiconductor chips 20A and 20B is composed of both the insulating material 31 covering the periphery of the first semiconductor chip 20A and the sealing layer 35 covering the periphery of the second semiconductor chip 20B.

As has been described above, according to the present embodiment, the joining of the semiconductor chips 20A to the support substrate 29 is carried out by fusing (fusion bonding) of the joining bumps 27 formed on the semiconductor chips 20A, and the removal of the support substrate 29 is carried out by polishing of the support substrate 29. Therefore, the adhesive having good temporary fixation performance and good stripping property (removability) which has been necessary in the related art can be unnecessitated. As a result, processings of the semiconductor chips 20A can be carried out without being restricted by the heat resisting temperature or chemical resistance of an adhesive, which enables formation of an insulating film 32 excellent in adhesion, for example, and stable patterning (FIG. 1G) of the external connection terminals 33. This ensures that the semiconductor apparatus 20 of the chip-on-chip structure in which the vias 26 for inter-layer connection are formed in the semiconductor chip 20A on the lower layer side can be manufactured with high accuracy and high reliability.

In addition, according to this embodiment, the first semiconductor chips 20A are produced by dicing the common semiconductor wafer W1 on a chip basis, and acceptable chips selected from among the produced individual chips an be used as the semiconductor chips 20A bump-bonded onto the support substrate 29. Therefore, it is possible to manufacture the semiconductor apparatus 20 in an enhanced yield.

Second Embodiment

Now, a second embodiment of the present invention will be described below.

FIGS. 2A to 2L are step sectional views for illustrating a method of manufacturing a semiconductor apparatus of the chip-on-chip structure according to the second embodiment of the present invention. Incidentally, in the figures, the portions corresponding to those in the first embodiment above are denoted by the same symbols as used above, and detailed descriptions of these portions will be omitted.

Figure 2A:
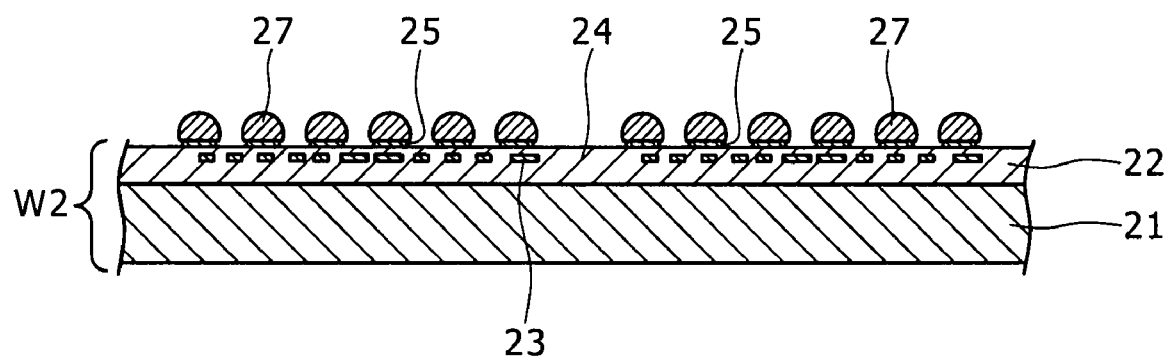
FIGS. 2A and 2B are step sectional views for illustrating a method of manufacturing a semiconductor apparatus according to a second embodiment of the present invention.
Figure 2B:
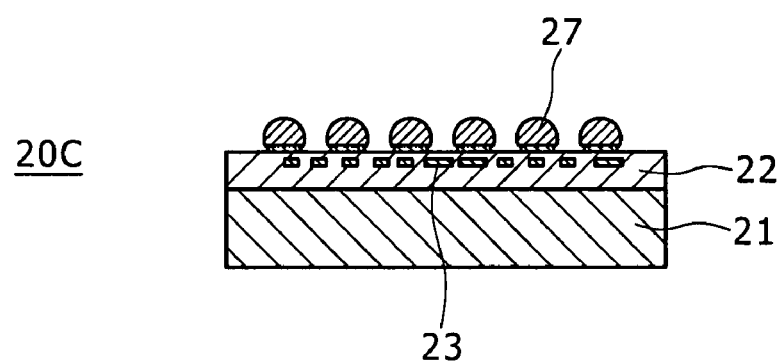

First, as shown in FIG. 2A, there is prepared a wafer W2 in which a device layer 22 including semiconductor devices, such as transistors, wiring 23, an insulating layer 24, and the like is formed on the face side of a substrate body (semiconductor substrate) 21 composed of silicon. A plurality of electrode pads 25 electrically connected to parts of the wiring 23 are disposed on the face side of the device layer 22, and bumps 27 are formed on the electrode pads 25. Then, the wafer W2 is diced on a chip basis, to produce first semiconductor chips 20C.

Here, the wafer W2 in this embodiment differs from the wafer W1 in the first embodiment above in that the buried conductor layer for forming the vias (through electrodes) is not formed in the inside of the substrate, and vias (through electrodes) 26 are separately formed after the step of thinning the semiconductor chips 20C described later (FIG. 2G).

Next, as shown in FIG. 2C, the plurality of semiconductor chips 20C thus produced are joined onto a support substrate 29 through the bumps 27. The support substrate 29 is preliminarily provided with dummy terminals 28 correspondingly to the array pitch of the bumps 27 on the semiconductor chips 20C, and the bumps 27 are fused (fusion-bonded) to the dummy terminals 28, whereby the semiconductor chips 20C are integrally fixed onto the support substrate 29, with their back side up.

Figure 2E:
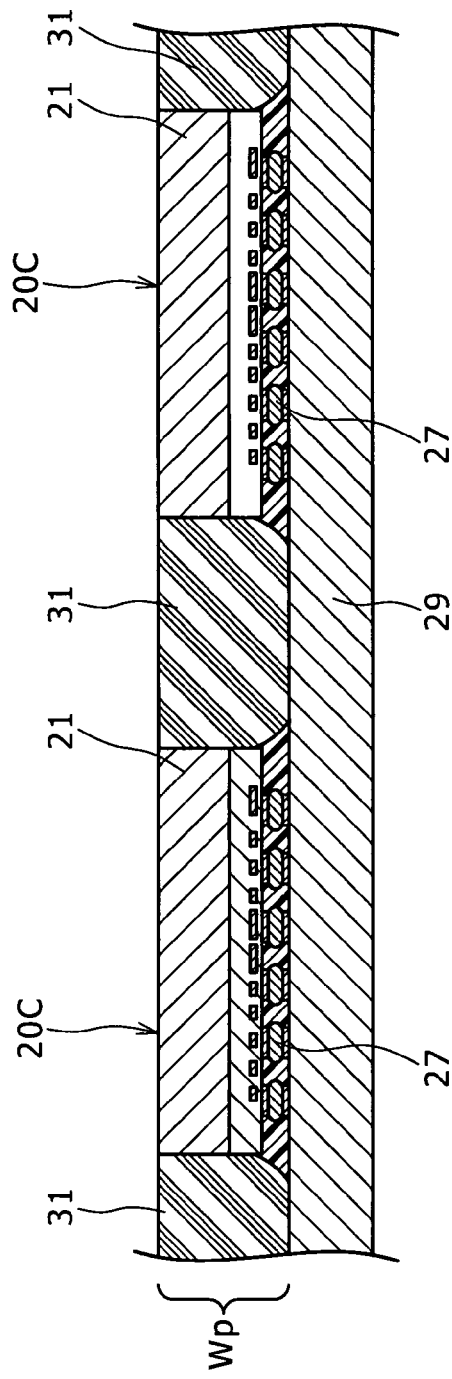
FIGS. 2E and 2F are step sectional views for illustrating the method of manufacturing a semiconductor apparatus according to the second embodiment of the present invention.

Subsequently, as shown in FIG. 2D, the gap between each of the flip chip bonded semiconductor chips 20C and the support substrate 29 is filled with an underfilling resin, to form an underfill layer 30. Next, as shown in FIG. 2E, the spaces between the mounted semiconductor chips 20C joined onto the support substrate 29 are filled with an insulating material 31, to form a pseudo-wafer Wp of which the upper surface is made flat (planar).

With the semiconductor chips 20C thus obtained in the pseudo-wafer, they can be handled in the wafer state in the subsequent processings, so that existing processing equipments can be used as they are. In addition, when acceptable chips preliminarily selected through electrical measurement are used as the semiconductor chips 20C to be joined to the support substrate 29 and the pseudo-wafer is obtained by a wafer molding technology, the pseudo-wafer can be subjected to the subsequent processings as a wafer in which acceptable chips are arranged. This promises an enhanced productivity and an enhanced yield.

Figure 2F:
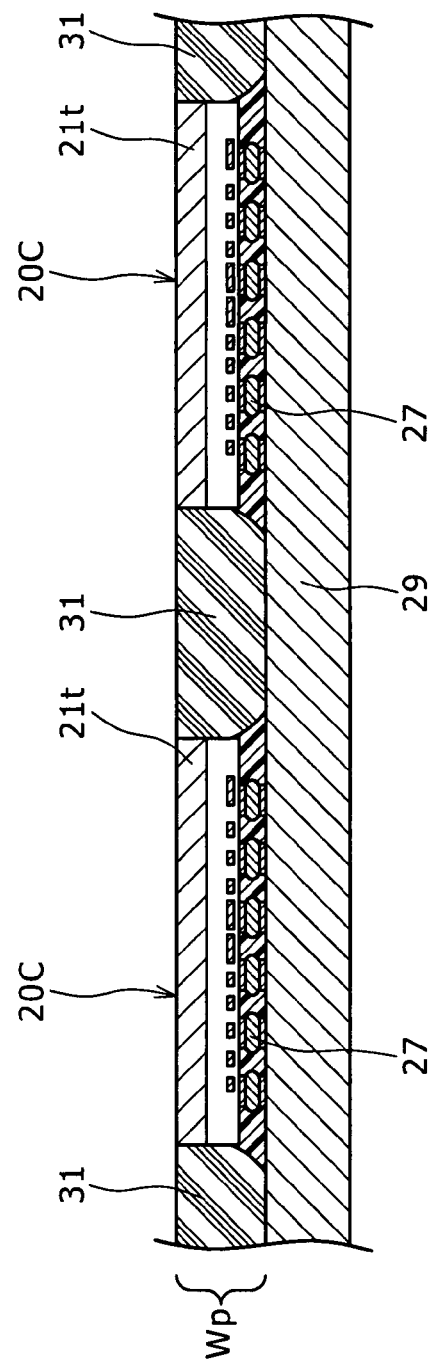
Figure 3:
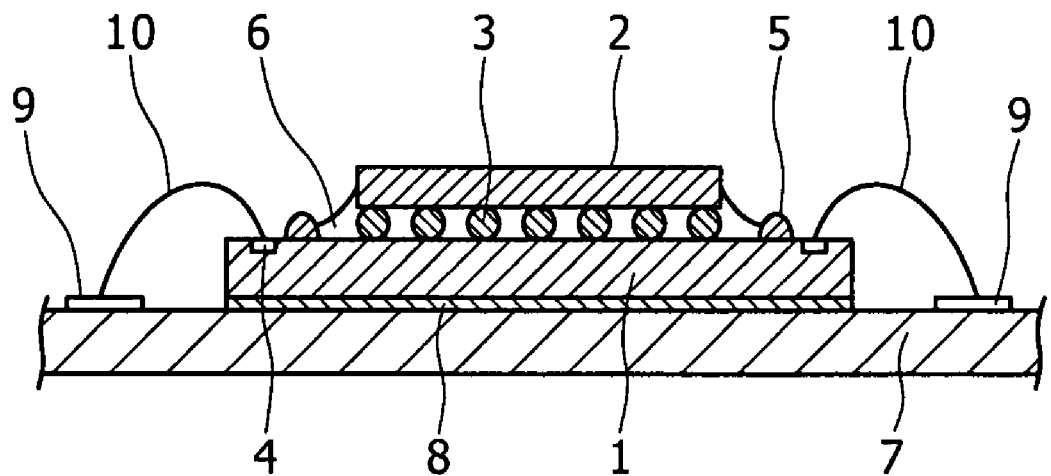
FIG. 3 is a sectional view schematically showing a configuration example of a semiconductor apparatus of the chip-on-chip structure.
Figure 4:
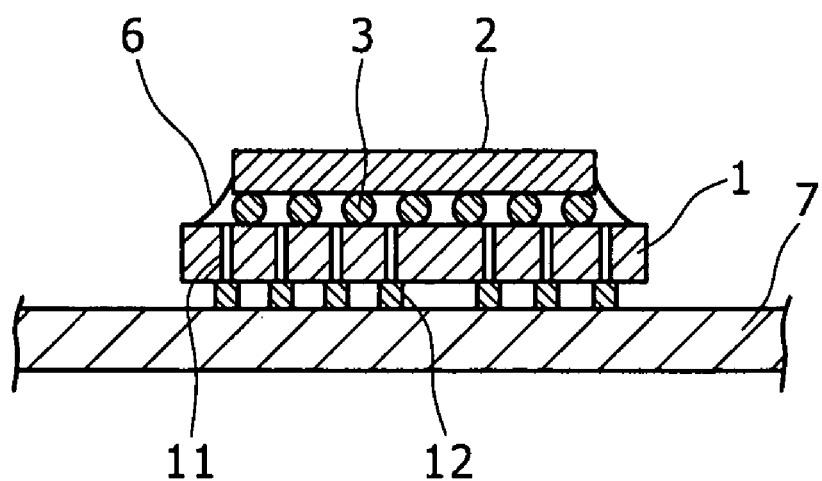
FIG. 4 is a sectional view schematically showing another configuration example of a semiconductor apparatus of the chip-on-chip structure.
Figure 5A:
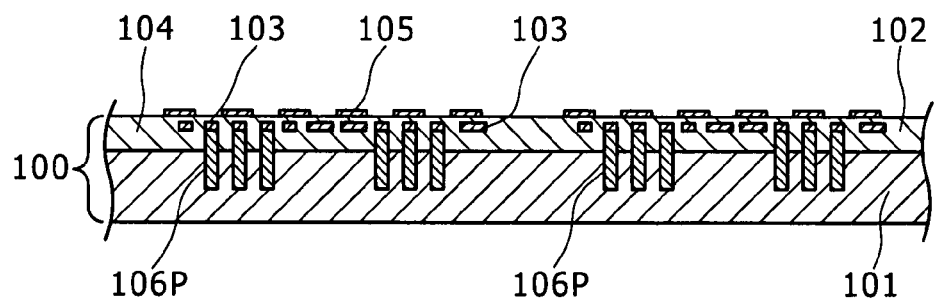
FIGS. 5A to 5D are step sectional views for illustrating a method of manufacturing a semiconductor apparatus according to a first related-art example.
Figure 5B:
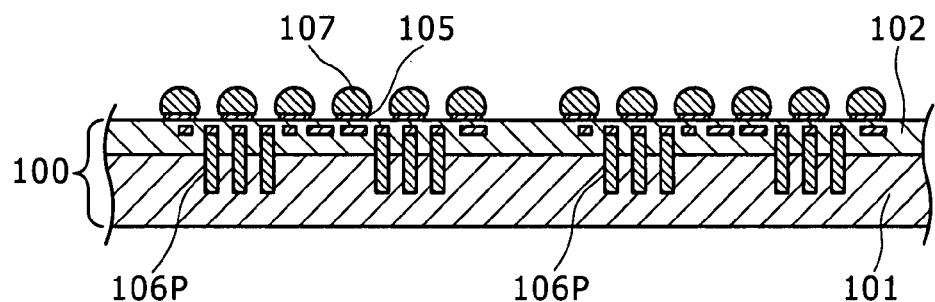
Figure 5C:
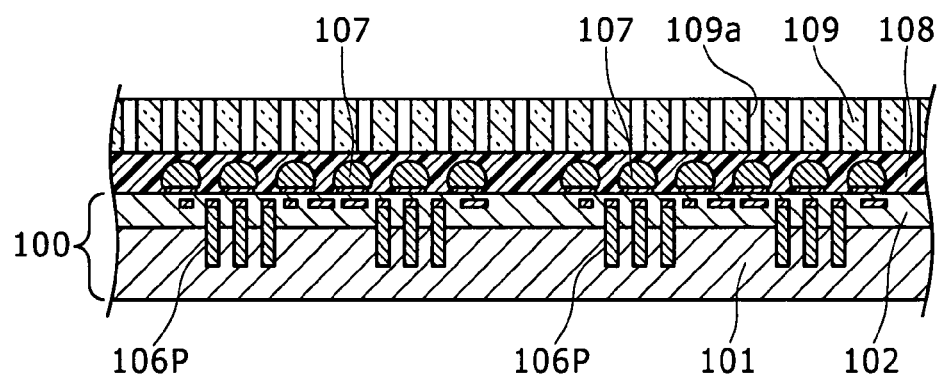
Figure 5D:
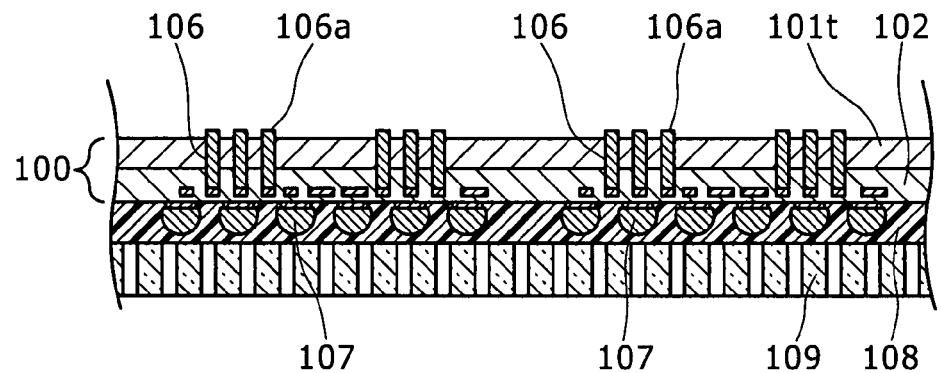
Figure 5E:
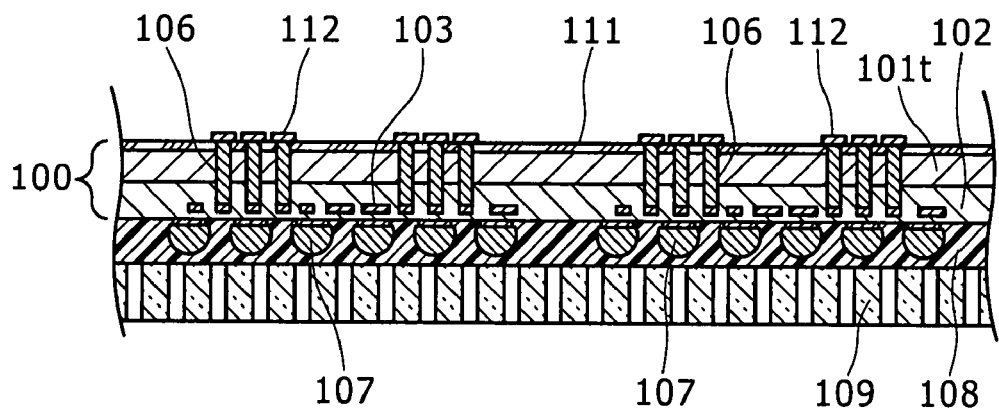
FIGS. 5E to 5G are step sectional views for illustrating the method of manufacturing a semiconductor apparatus according to the first related-art example.
Figure 5F:
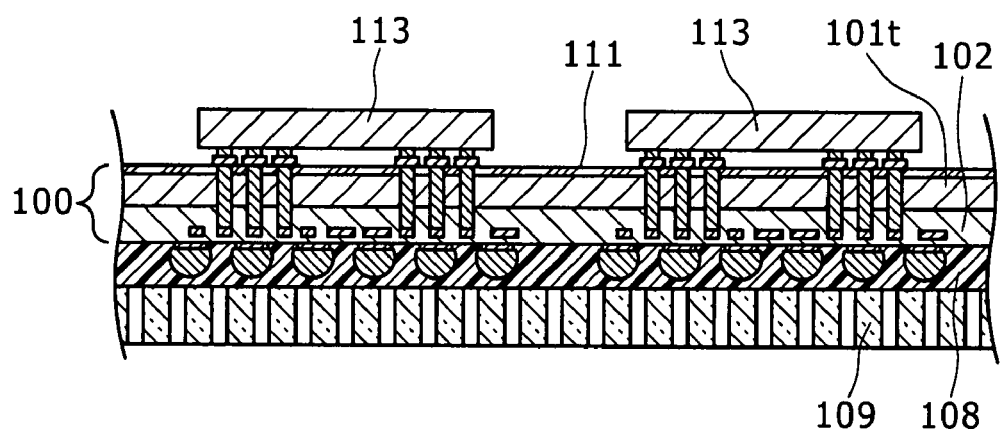
Figure 5G:
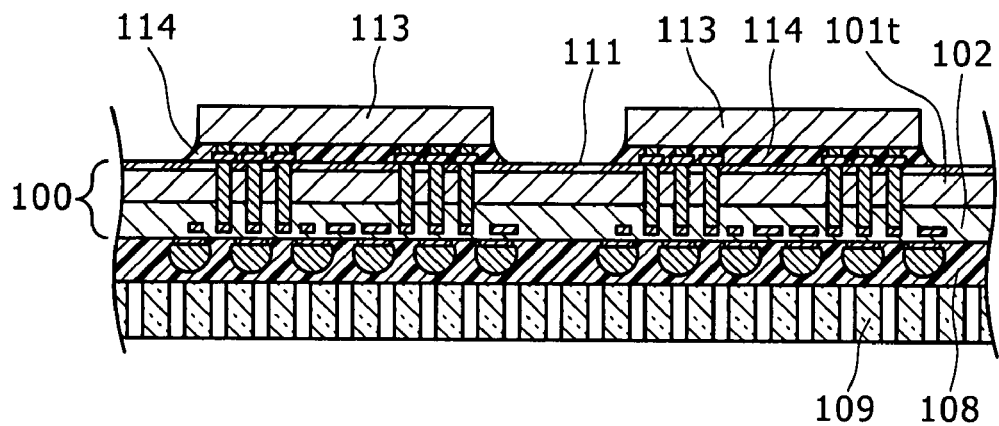
Figure 5H:
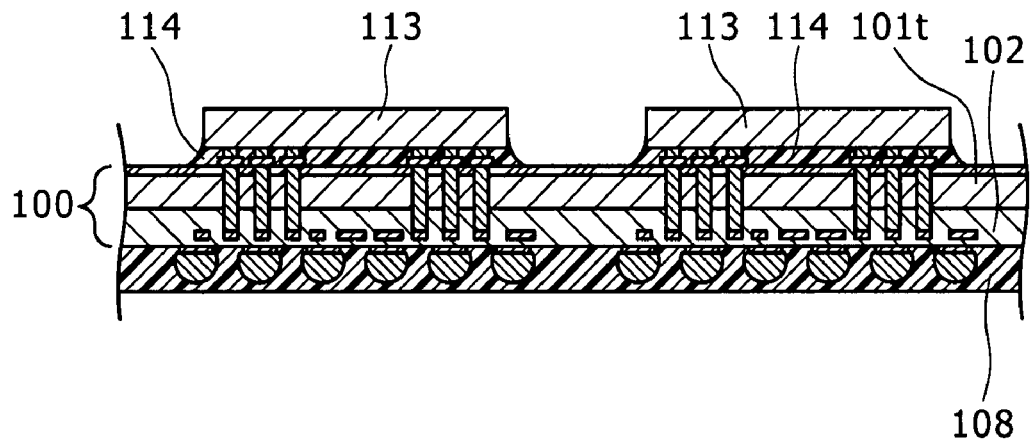
FIGS. 5H to 5J are step sectional views for illustrating the method of manufacturing a semiconductor apparatus according to the first related-art example.
Figure 5I:
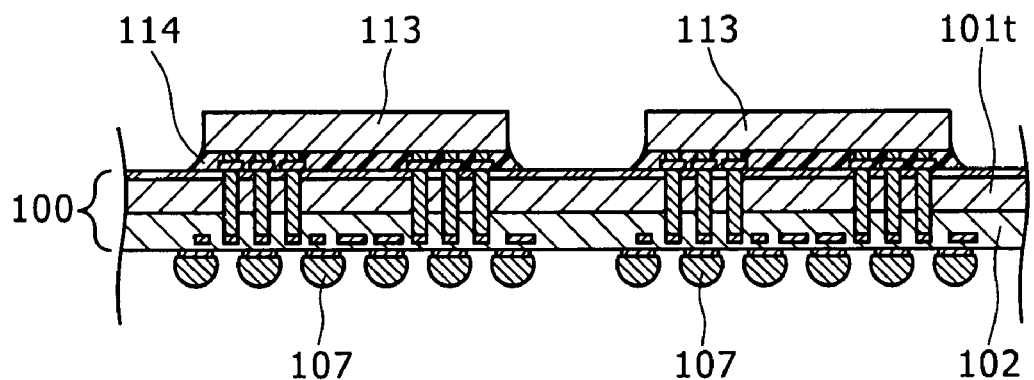
Figure 5J:
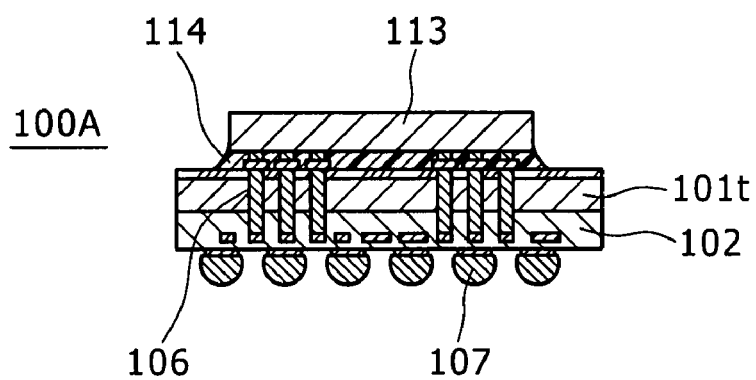
Figure 6A:
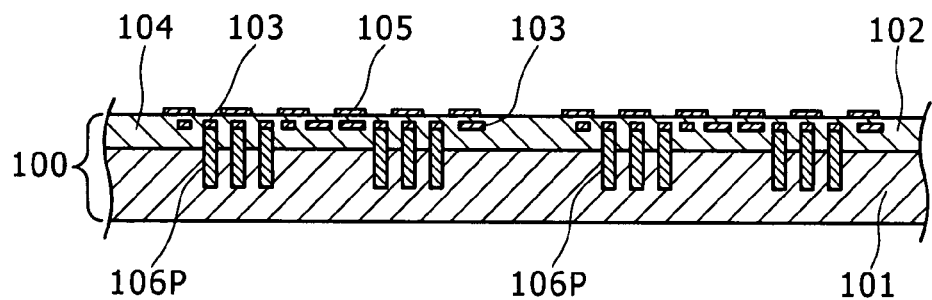
FIGS. 6A to 6D are step sectional views for illustrating a method of manufacturing a semiconductor apparatus according to a second related-art example.
Figure 6B:
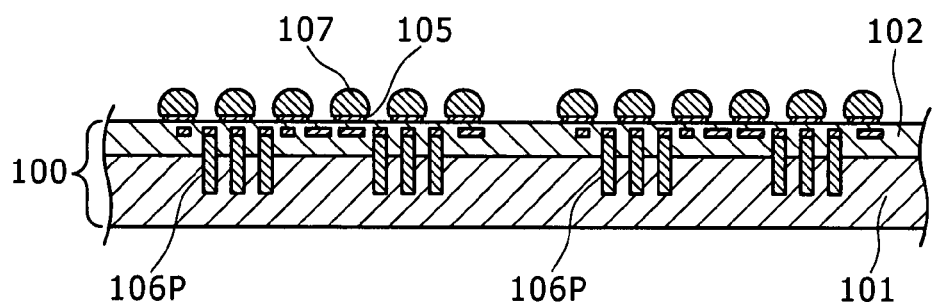
Figure 6C:
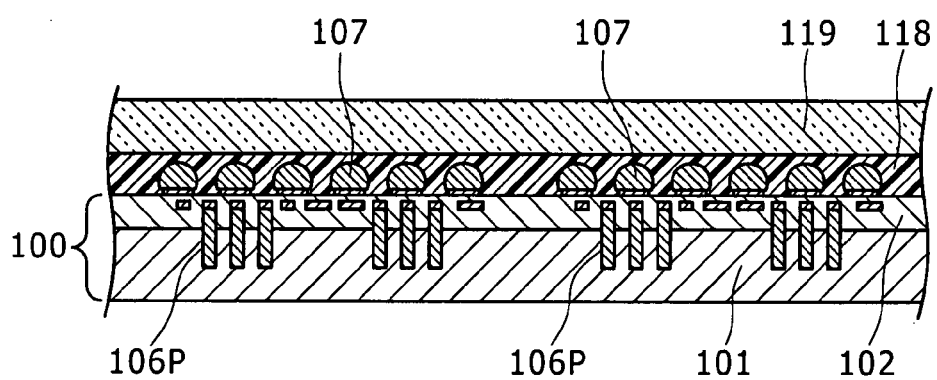
Figure 6D:
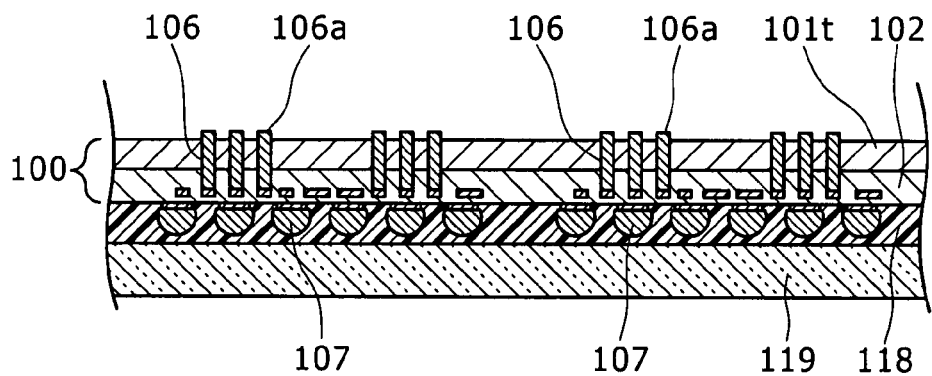
Figure 6E:
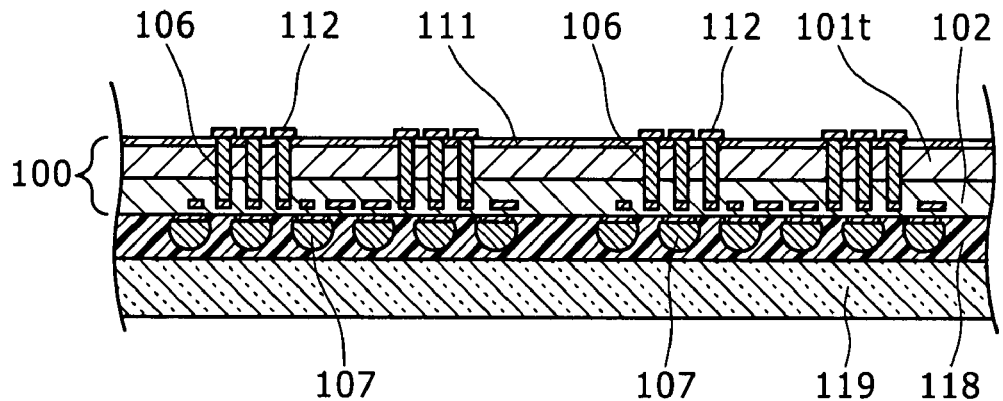
FIGS. 6E to 6G are step sectional views for illustrating the method of manufacturing a semiconductor apparatus according to the second related-art example.
Figure 6F:
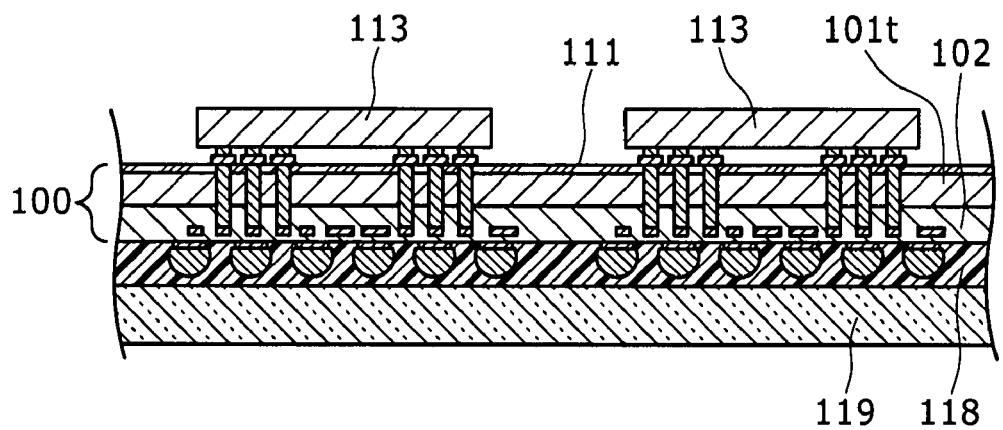
Figure 6G:
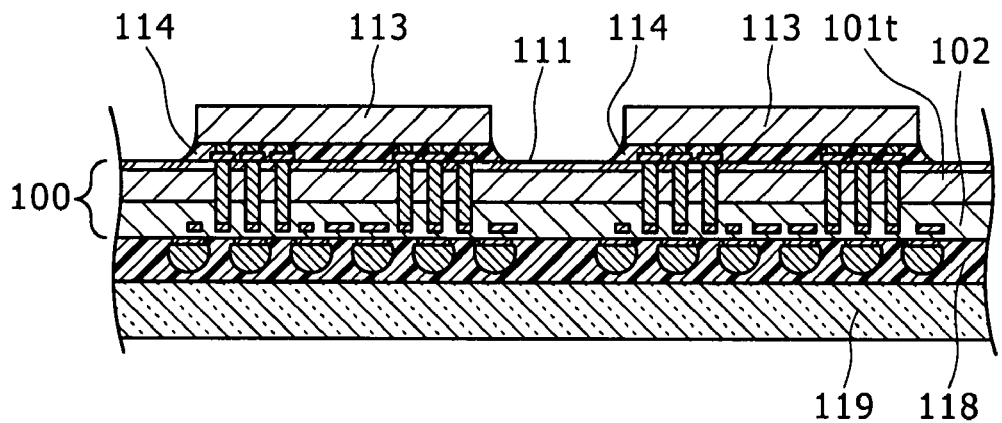
Figure 6H:
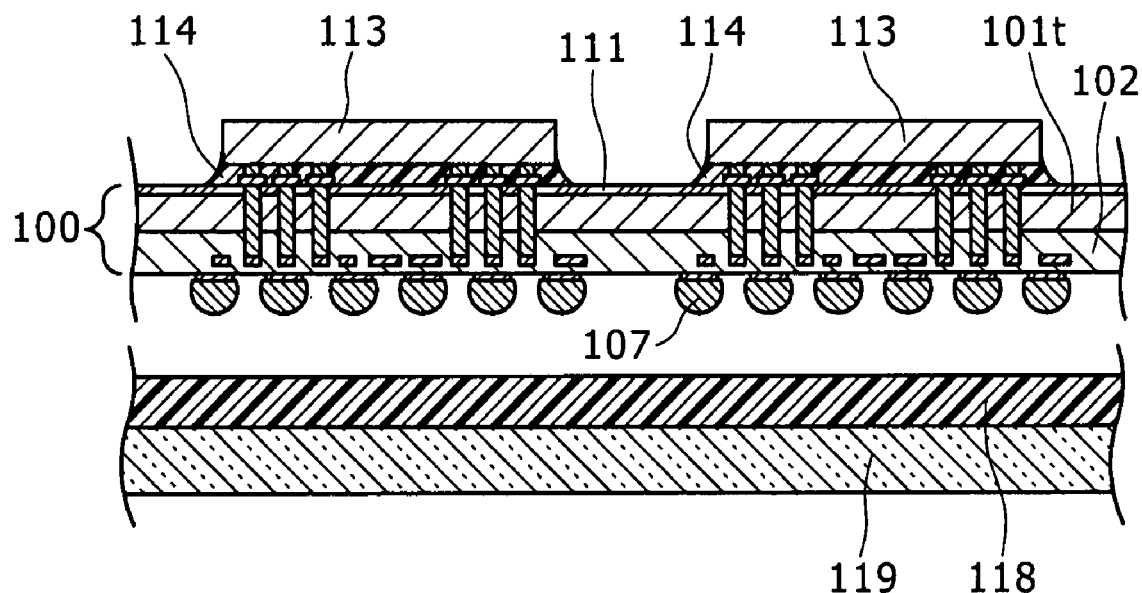
FIGS. 6H and 6I are step sectional views for illustrating the method of manufacturing a semiconductor apparatus according to the second related-art example.
Figure 6I:
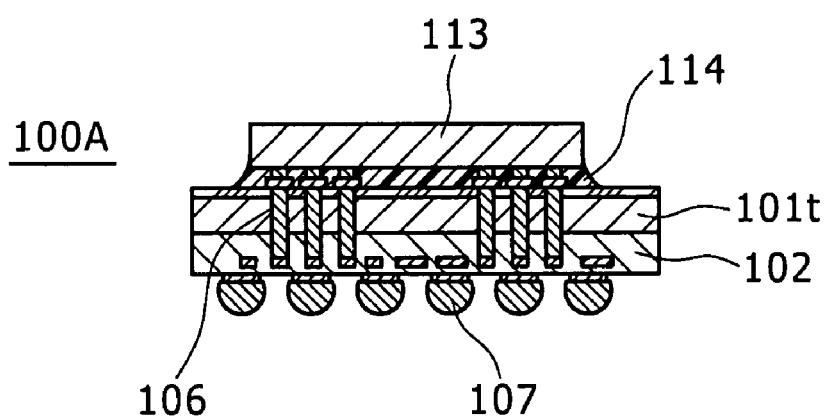

Next, as shown in FIG. 2F, the pseudo-wafer Wp formed on the support substrate 29 is polished, to thin the substrate body 21 of each of the semiconductor chips 20C. Then, as shown in FIG. 2G, vias (through electrodes) 26 penetrating the thinned substrate body 21t and connected to the predetermined wiring 23 at ends thereof are formed from the back side of the substrate body 21t. The vias 26 can be formed by a method in which inter-layer contact holes are formed by a dry process such as plasma etching, and thereafter insulation of the inside wall surfaces of the holes and formation of conductor platings of copper or the like are carried out. Further, a predetermined insulating treatment such as forming of an insulating film 32 is applied to the back side of the semiconductor chips 20C, and external connection terminals 33 are formed on tip portions of the vias 26. The external connection terminal 33 is electrically connected to the bump 27 through the via 26, the wiring 23, and the electrode pad 25.

Next, as shown in FIG. 2H, second semiconductor chips 20B are mounted onto the external connection terminals 33 on the (first) semiconductor chips 20C. A plurality of bumps 36 are preliminarily formed on the mounting surface of each semiconductor chip 20B, and the semiconductor chip 20B is joined onto the external connection terminal 33 by flip chip bonding through the bumps 36. Thereafter, as shown in FIG. 2I, an underfill layer 34 is formed between the first semiconductor chip 20C and the second semiconductor chip 20B joined to each other.

Next, as shown in FIG. 2J, a sealing layer 35 is formed on the pseudo-wafer Wp, and the spaces between the mounted second semiconductor chips 20B are filled with a resin constituting the sealing layer 35, whereby the upper surface of the pseudo-wafer Wp is made flat (planar). With the sealing layer 35 thus formed, semiconductor apparatuses of the stack structure of the first and second semiconductor chips 20C and 20B can be assembled in the form of a pseudo-wafer on the support substrate 29. Incidentally, the sealing layer 29 may be polished so as to thin the second semiconductor chips 20B, if necessary.

Subsequently, as shown in FIG. 2K, the support substrate 29 is removed from the pseudo-wafer Wp. The removal of the support substrate 29 is carried out by polishing the support substrate 29 by use of the BGR or CMP technology. The step of removing the support substrate 29 is conducted until the bumps 27 of the first semiconductor chips 20C are exposed from the lower surface of the pseudo-wafer Wp. In this case, since the upper surface of the pseudo-wafer Wp is made flat (planar) by the presence of the sealing layer 35, the pseudo-wafer Wp can be supported stably and appropriately by supporting jigs in a polishing equipment, which promises appropriate polishing of the support substrate 29.

The bumps 27 can later be used as connection terminals for a mounting substrate (not shown). In addition, since the periphery of each of the bumps 27 is supported by the underfill layer 30, the step of exposing the bumps 27 during the removal of the support substrate 29 can be carried out appropriately.

Finally, as shown in FIG. 2L, the pseudo-wafer Wp deprived of the support substrate 29 is diced on a chip basis, to produce semiconductor apparatuses of a three-dimensional stack structure of the first and second semiconductor chips 20C and 20B. In the semiconductor apparatus 20, electrical connection between the second semiconductor chip 20B and the first semiconductor chip 20C and electrical connection between the second semiconductor chip 20B and the bumps 27 are realized through the vias 26 formed in the first semiconductor chip 20C. Besides, in the semiconductor apparatus 20, an armor package for protecting the first and second semiconductor chips 20C and 20B is composed of both the insulating material 31 covering the periphery of the first semiconductor chip 20C and the sealing layer 35 covering the periphery of the second semiconductor chip 20B.

By the method of manufacturing a semiconductor apparatus 20 according to this embodiment, also, the same effects as those of the first embodiment above can be obtained.

While the embodiments of the present invention have been described above, the invention naturally is not limited to the embodiments, and various modifications are possible based on the technical thought of the invention.

For example, while an example in which the present invention is applied to the manufacture of a semiconductor apparatus 20 of the chip-on-chip structure has been described in the above embodiments, the invention is not limited to the example. The invention applicable also to a step of thinning a substrate to be treated on a wafer level by back grinding, a step of mounting devices onto the substrate to be treated, and the like steps.

Besides, while the manufacture of a semiconductor apparatus in which first and second semiconductor chips are stacked has been described as an example in the above embodiments, the number of semiconductor chips stacked may be further increased. In that case, vias (through electrodes) for inter-layer connection formed for a semiconductor chip on the lower layer side can be formed in the same manner as in the above embodiment.

It should be understood by those skilled in the art that various modifications, combinations, sub-combinations and alternations may occur depending on design requirements and other factors insofar as they are within the scope of the appended claims or the equivalent thereof.

What is claimed is:

1. A method of manufacturing a semiconductor apparatus, comprising the steps of:

fabricating a plurality of first semiconductor chips, with each provided over a surface thereof a bump for external connection;

joining said plurality of first semiconductor chips to a dummy support substrate through said bumps, said bumps defining an interface between the first semiconductor chips and the dummy support substrate;

filling the spaces between said plurality of first semiconductor chips with an insulating material so as to form a pseudo-wafer over said dummy support substrate;

polishing a surface of said pseudo-wafer opposite the dummy support substrate so as to reduce the thickness of the pseudo-wafer and each said first semiconductor chip;

forming an external connection terminal on the back side of each said first semiconductor chip electrically connected to each said respective bump formed on the opposite side of each said first semiconductor chip;

mounting second semiconductor chips over said external connection terminals;

removing said dummy support substrate by polishing so as to at least partially expose said bumps; and dicing said pseudo-wafer on a chip by chip basis.

2. The method of manufacturing a semiconductor apparatus as set forth in claim 1, wherein after said joining of said first semiconductor chips to said dummy support substrate, an underfill layer is formed between said dummy support substrate and said first semiconductor chips.

3. A method of manufacturing a semiconductor apparatus as set forth in claim 1, wherein each said first semiconductor chip is previously provided therein with a buried conductor layer that is subsequently electrically connected to said respective bump, and, subsequent to said reduction of the thickness of each said first semiconductor chip, a tip part of said buried conductor layer is exposed from the back side of said first semiconductor chip via chemical etching so as to form said external connection terminal.

4. The method of manufacturing a semiconductor apparatus as set forth in claim 1, further comprising the step of:
forming a sealing resin layer for sealing said second semiconductor chips, after said mounting of said second semiconductor chips.

5. The method of manufacturing a semiconductor apparatus as set forth in claim 1, wherein said dummy support substrate as has dummy terminals formed thereon for interfacing with said bumps.

6. The method of manufacturing a semiconductor apparatus as set forth in claim 1, wherein said dummy support substrate is formed of a material having substantially the same coefficient of thermal expansion as said first semiconductor chips.

7. The method of manufacturing a semiconductor apparatus as set forth in claim 1, further comprising the step of electrically testing each of said first semiconductor chips, and only joining known non-defective first semiconductor chips via said bumps to said dummy support substrate.

8. The method of manufacturing a semiconductor apparatus as set forth in claim 7, further comprising the step of electrically testing each of said second semiconductor chips, and only joining known non-defective second semiconductor chips via external connection terminals.

9. A substrate treating method comprising the steps of:
joining a one-side surface of a substrate to be treated to a dummy support substrate;
treating said substrate to be treated in the condition where said substrate to be treated is supported by said dummy support substrate; and
removing said dummy support substrate from said substrate to be treated;
wherein said step of joining said substrate to be treated to said dummy support substrate includes melting one or more joint bumps formed over one or both of said substrate to be treated and said support substrate so as to define an interface between and join said substrate to be treated and said dummy support substrate, and
said step of removing said dummy support substrate from said substrate to be treated includes polishing said dummy support substrate so as to remove said dummy support substrate and expose at least a portion of said one or more joint bumps, wherein said substrate to be treated has connection vias for connecting between said respective bumps and a back surface side of said substrate to be treated formed therein prior to said polishing step, and wherein after said polishing step, a tip part of said connection vias are exposed from the back side of said substrate to be treated via chemical etching so as to form external connection terminals.

10. The method of manufacturing a semiconductor apparatus as set forth in claim 9, wherein after said polishing step, connection vias for connecting between said bumps and a back surface side of said substrate to be treated are formed in the substrate to be treated.

* * * * *